(12) United States Patent
Chen et al.

(10) Patent No.: US 10,998,397 B2
(45) Date of Patent: *May 4, 2021

(54) CAPACITOR STRUCTURE WITH LOW CAPACITANCE

(71) Applicant: Taiwan Semiconductor Manufacturing Co., Ltd., Hsinchu (TW)

(72) Inventors: Tai-Yi Chen, Hsinchu (TW); Chung-Chieh Yang, Zhubei (TW); Yung-Chow Peng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/834,265

(22) Filed: Mar. 30, 2020

(65) Prior Publication Data

US 2020/0227516 A1 Jul. 16, 2020

Related U.S. Application Data

(63) Continuation of application No. 16/216,889, filed on Dec. 11, 2018, now Pat. No. 10,629,672.

(60) Provisional application No. 62/712,632, filed on Jul. 31, 2018.

(51) Int. Cl.
*H01L 49/02* (2006.01)
*H01L 23/522* (2006.01)

(52) U.S. Cl.
CPC .......... *H01L 28/60* (2013.01); *H01L 23/5223* (2013.01)

(58) Field of Classification Search
None
See application file for complete search history.

(56) References Cited

U.S. PATENT DOCUMENTS

| 10,629,672 B2* | 4/2020 | Chen | H01L 28/60 |
|---|---|---|---|
| 2006/0270145 A1* | 11/2006 | Bach | H01L 27/0805 |
| | | | 438/239 |
| 2009/0206958 A1* | 8/2009 | Chow | H01L 23/48 |
| | | | 333/247 |
| 2013/0113077 A1* | 5/2013 | Woo | H01L 23/5222 |
| | | | 257/532 |
| 2013/0200489 A1* | 8/2013 | Huang | H01L 28/60 |
| | | | 257/532 |
| 2014/0145301 A1* | 5/2014 | Moghe | H01L 27/0292 |
| | | | 257/532 |

(Continued)

*Primary Examiner* — J. E. Schoenholtz
(74) *Attorney, Agent, or Firm* — Duane Morris LLP

(57) ABSTRACT

Capacitor structures with low capacitances are disclosed. In one example, a capacitor structure is disclosed. The capacitor structure includes a first electrode and a second electrode. The first electrode comprises a first metal finger. The second electrode comprises a second metal finger and a third metal finger that are parallel to each other and to the first metal finger. The first metal finger is formed between the second metal finger and the third metal finger. The capacitor structure further includes: a fourth metal finger formed as a dummy metal finger between the first metal finger and the second metal finger, and a fifth metal finger formed as a dummy metal finger between the first metal finger and the third metal finger. The fourth metal finger and the fifth metal finger are parallel to the first metal finger.

19 Claims, 16 Drawing Sheets

(56) References Cited

U.S. PATENT DOCUMENTS

2014/0374881 A1* 12/2014 Lu .......................... H01L 28/88
                                                        257/532
2019/0244894 A1*  8/2019 Fu .......................... H01G 4/228

* cited by examiner

CAPACITOR STRUCTURE WITH LOW CAPACITANCE

CROSS-REFERENCE TO RELATED APPLICATIONS

The present application is a continuation of U.S. patent application Ser. No. 16/216,889, filed on Dec. 11, 2018, which claims priority to U.S. Provisional Patent Application No. 62/712,632, filed on Jul. 31, 2018, each of which is incorporated by reference herein in its entirety.

BACKGROUND

Internet of Things (IoT) development has induced many low power applications of integrated circuits. Since an operation current of an integrated circuit in low power mode is quite small, capacitors with low capacitances are desired for high resolution applications utilizing switched capacitors and SAR (successive approximation register)-ADCs (analog-to-digital converters), for example.

A low capacitance capacitor, e.g. a sub-femtofarad (sub-fF) metal-oxide-metal (MOM) capacitor, in an integrated circuit often suffers from mismatch and is thus difficult to design. There are three conventional methods to form low capacitance capacitors: shrinking finger length, increasing the space between fingers, and connecting multiple capacitors in series.

However, shrinking finger length leads to worse mismatching performance and a mean shift of capacitors at the edge and the center of a capacitor array due to a smaller area of the capacitor fingers. Increasing space between fingers introduces a low metal density risk in process control of the integrated circuit. While a uniform metal density is usually desired according to a circuit design rule, a capacitor with a lower metal density compared to its surrounding components in the integrated circuit impacts the operation performance of the surrounding components. Lastly, connecting multiple conventional capacitors in series introduces an abutting problem, where the series connection needs an extra metal line and enlarges the area of the integrated circuit.

As such, existing capacitor structures are not entirely satisfactory for designing capacitors with low capacitances.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

DETAILED DESCRIPTION

Figure 1A:
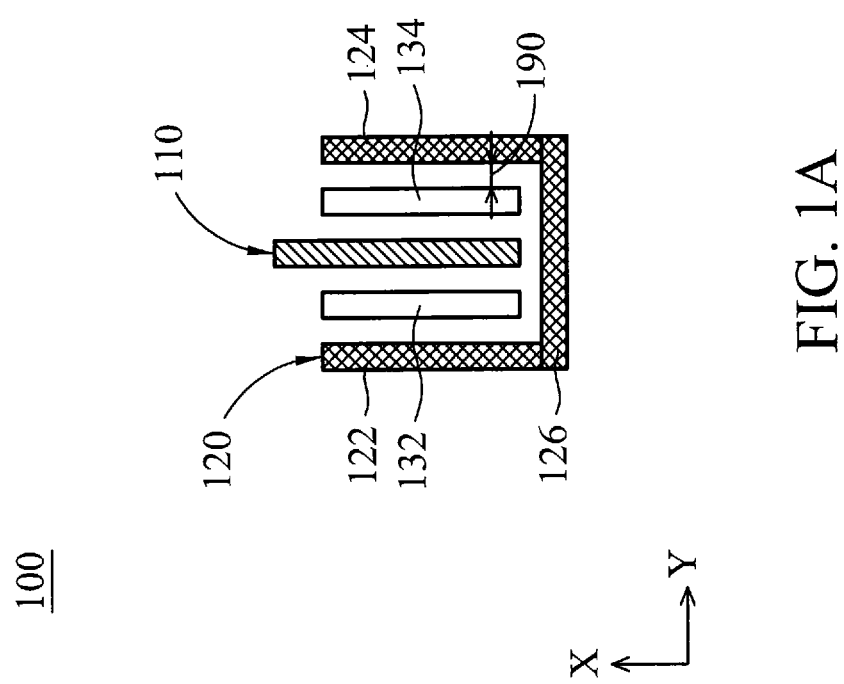
FIG. 1A is a cross-sectional view of an exemplary capacitor structure, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

Motivated by a demand of low capacitance capacitors, e.g. sub-femtofarad (sub-fF) metal-oxide-metal (MOM) capacitors, in low power applications of integrated circuits, the present teaching provides various embodiments of capacitor structures and capacitor arrays that have better matching performance, better process uniformity, and better abutting performance than conventional capacitors.

In some embodiments of the present teaching, a unit capacitor or capacitor cell includes a first electrode and a second electrode. The first electrode has a first metal finger. The second electrode has a second metal finger, a third metal finger and a bus line coupled to the second metal finger and the third metal finger. The first metal finger is formed between the second metal finger and the third metal finger and is parallel to the second metal finger and the third metal finger. To reduce capacitance, the capacitor cell further includes dummy metal fingers inserted between the first electrode and the second electrode. For example, a dummy metal finger may be inserted between the first metal finger and the second metal finger, and another dummy metal finger may be inserted between the first metal finger and the third metal finger. In this manner, the metal fingers including the dummy metal fingers form a plurality of sub-capacitors connected in series, to generate a low capacitance capacitor at capacitor cell level. In the present teaching, the terms "unit capacitor," "capacitor cell," "capacitor structure," and "capacitor" may be used interchangeably herein.

With the dummy metal finger insertion, the space or distance between fingers is effectively increased while metal density of the capacitor is not decreased. Because the disclosed method does not introduce a low metal density at the capacitor, there is no density gradient effect (DGE). Therefore, the disclosed capacitor structure has less impact to other circuit components nearby, which improves process uniformity of the integrated circuit. In addition, the disclosed capacitor structure has a series connection at the capacitor cell level, which has a better matching performance than a single-capacitor cell. The matching performance difference will be more obvious in an integrated circuit with more capacitors and/or capacitor arrays.

The disclosed dummy metal finger insertion may be performed along a horizontal direction and/or a vertical direction. For example, the disclosed capacitor cell may have a multi-layer structure with series connection within the capacitor cell, which makes its matching performance even better.

To confine electric-magnetic (EM) field to reduce electric loss of the capacitor, the disclosed capacitor structure further includes a metal shelter, e.g. at a top layer and/or a bottom layer of the multi-layer structure, to protect the EM field from leaking outside the capacitor, i.e. to prevent fringe effect of the capacitor. The capacitor structure may also have vias at the side-walls to reduce the fringe effect.

The present teaching also provides a capacitor array including a plurality of unit capacitors connected in series. Each of the unit capacitors may have a capacitor structure as discussed above, with dummy metal fingers inserted. In one example, each of the unit capacitors has a same number of dummy metal fingers. In another example, at least two of the unit capacitors have different numbers of dummy metal fingers. The capacitor array includes a common bus line shared by the plurality of unit capacitors. In addition, each pair of neighboring unit capacitors in the capacitor array share a common side metal finger to save area for the integrated circuit. In one embodiment, distances between every pair of neighboring metal fingers in the capacitor array are the same and minimized; and each metal finger in the capacitor array has a same and minimized width, which provides a same metal density across all unit capacitors in the capacitor array. As such, the disclosed capacitor structure and capacitor array provide better metal density uniformity and better process control for the integrated circuit. This can meet critical criteria of low power circuits, e.g. in Internet of Things (IoT) applications.

FIG. 1A is a cross-sectional view of an exemplary capacitor structure 100, in accordance with some embodiments of the present disclosure. In accordance with one embodiment, the capacitor structure 100 may be a capacitor cell in an integrated circuit in a low power application, which desires the capacitor structure 100 to have a low capacitance, e.g. lower than 1 fF or even lower than 0.1 fF. As shown in FIG. 1A, the capacitor structure 100 includes a first electrode 110 and a second electrode 120. In one example, the first electrode 110 is a signal electrode that is connected to a signal line or data line of the circuit, while the second electrode 120 is a common electrode that may be coupled to a common electrode of another capacitor.

In this example, the second electrode 120 includes two metal fingers 122, 124; and the first electrode 110 includes a metal finger formed between the two metal fingers 122, 124. The metal fingers here may be metal plates or surfaces that are parallel to each other. The second electrode 120 further includes a bus line 126 that is coupled to the two metal fingers 122, 124. The bus line 126 may have a conductive material connecting the two metal fingers 122, 124. In one example, the bus line 126 and the two metal fingers 122, 124 have a same metal material.

If the space between two neighboring metal fingers, e.g. between the metal finger of the first electrode 110 and one of the two metal fingers 122, 124, is increased without any insertion, the capacitance of the first electrode 110 will be decreased, but the metal density of the first electrode 110 will be lower than nearby circuit components, which can impact the performance of the nearby circuit components. In this embodiment, a dummy metal finger is inserted and formed between the two electrodes. For example, a dummy metal finger 132 is inserted between the first electrode 110 and the metal finger 122 of the second electrode 120; and a dummy metal finger 134 is inserted between the first electrode 110 and the metal finger 124 of the second electrode 120. As shown in FIG. 1A, the metal fingers of the electrodes and the dummy metal fingers form a series connection capacitor structure at the capacitor cell level. For example, the first electrode 110 and the dummy metal finger 134 form a first sub-capacitor; and the dummy metal finger 134 and the metal finger 124 of the second electrode 120 form a second sub-capacitor that is connected to the first sub-capacitor in series.

In one embodiment, the space or distance 190 between each pair of neighboring metal fingers in the capacitor structure 100 is the same and has been minimized to a value D to reduce the area occupied by the fingers on the integrated circuit. As shown in FIG. 1A, the distance 190 means a distance between two neighboring metal fingers along a Y direction. Compared to a reference capacitor without the dummy metal fingers and with the same D distance between each pair of neighboring metal fingers, the capacitor structure 100 has a capacitance that is 50% lower than that of the reference capacitor. For example, if the reference capacitor has a capacitance of 0.1 fF, the capacitor structure 100 will have a capacitance of 0.05 fF. At the same time, the capacitor structure 100 has a same metal density as that of the reference capacitor. As such, the disclosed capacitor structure does not impact existing capacitor manufacturing process. In addition, the finite discrete finger spaces between neighboring metal fingers in the capacitor structure 100 provides a better process control for the integrated circuit manufacturing. In some embodiments, each metal finger in the capacitor structure 100 has a same and minimized width that is measured along the Y direction, to further save area of the integrated circuit and provide a better process control. In some embodiments, each metal finger in the capacitor structure 100 has a length measured along an X direction that is orthogonal to the Y direction, wherein the length may be decreased or minimized to further reduce the capacitance of the capacitor structure 100.

In one example, the metal fingers of the electrodes and the dummy metal fingers have a same metal material. In another example, the metal fingers of the electrodes and the dummy metal fingers have different metal materials. In some embodiments, each pair of neighboring metal fingers are separated by a dielectric medium having a material made of at least one of: glass, ceramic, plastic film, paper, mica, and oxide layers. In some embodiments, the capacitor structure 100 is a finger metal-oxide-metal (MOM) capacitor.

The capacitor structure 100 has a series connection structure at the capacitor cell level. This series connection structure can provide a better matching performance than that of a normal single-capacitor cell having a single capacitor without parallel or series connection. Matching performance of a capacitor cell herein means a performance of capacitance variation when the capacitor cell is replicated multiple times. For example, an integrated circuit may include a plurality of capacitor cells having a same structure. However, due to manufacturing control, capacitor location, and other factors, the plurality of capacitor cells may have various capacitances around a center mean. In general, it is better to have a smaller difference between a given capacitance and the center mean. A mismatch of a capacitor structure may be represented by a standard deviation of a distribution of the capacitances of the plurality of capacitor cells having the capacitor structure. A smaller standard deviation here means a better matching/mismatching performance.

Figure 1B:
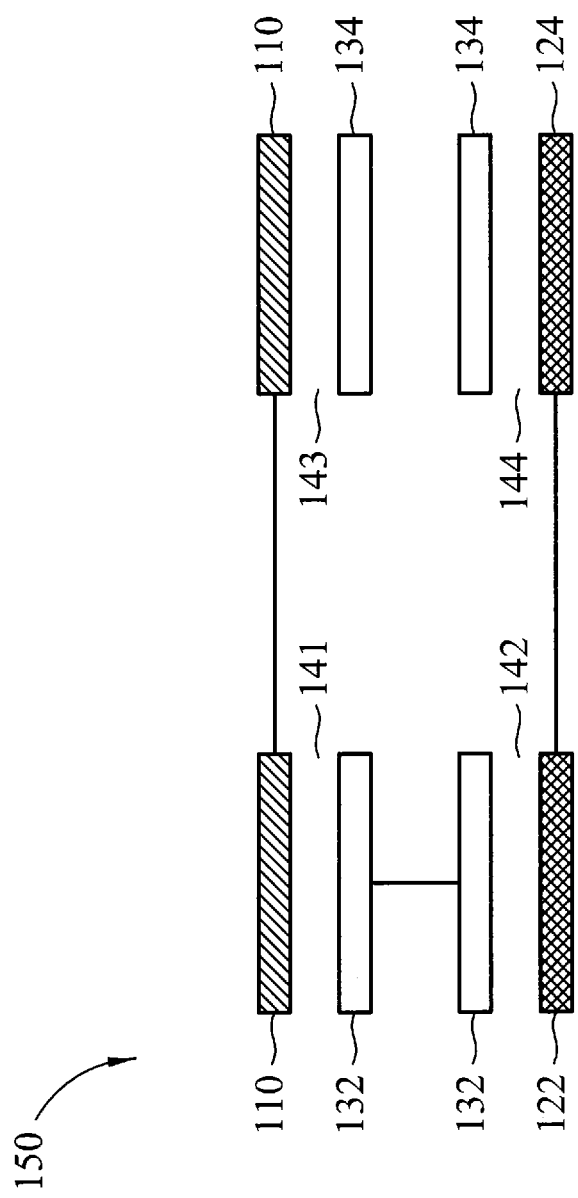
FIG. 1B shows a circuit diagram for the exemplary capacitor structure in FIG. 1A, in accordance with some embodiments of the present disclosure.

FIG. 1B shows a circuit diagram for the exemplary capacitor structure 100 in FIG. 1A, in accordance with some embodiments of the present disclosure. As shown in FIG. 1B, the 110 and the 132 form a unit capacitor 141; the 132 and the 122 form a unit capacitor 142; the 110 and the 134 form a unit capacitor 143; and the 134 and the 124 form a unit capacitor 144. Corresponding to the capacitor structure 100 in FIG. 1A, the unit capacitor 141 and the unit capacitor 142 are connected in series to form a first serially-connected capacitor; and the unit capacitor 143 and the unit capacitor 144 are connected in series to form a second serially-connected capacitor. The first serially-connected capacitor and the second serially-connected capacitor are connected in parallel to form a parallel-series connected capacitor 150. As an example, when each of the capacitors 141, 142, 143, 144 has a capacitance of 0.1 fF, the first serially-connected capacitor will have a capacitance of 0.05 fF, and the second serially-connected capacitor will have a capacitance of 0.05 fF as well. Accordingly, the parallel-series connected capacitor 150 will have a capacitance of 0.1 fF.

For a first reference capacitor without any dummy metal finger and with the same D distance 190 between each pair of neighboring metal fingers, the first reference capacitor is formed by connecting two unit capacitors in parallel. Each of these two unit capacitors has a same capacitance as that of each of the capacitors 141, 142, 143, 144, due to the same distance D. Referring to the above example, each of these two unit capacitors has a capacitance of 0.1 fF. As such, the first reference capacitor has a capacitance of 0.2 fF. Compared to the first reference capacitor, the parallel-series connected capacitor 150 with inserted dummy metal has a same metal density but a smaller capacitance.

For a second reference capacitor without any dummy metal finger and with a larger distance 2*D between each pair of neighboring metal fingers, the second reference capacitor is formed by connecting two unit capacitors in parallel. Each of these two unit capacitors has a capacitance that is half of the capacitance of each of the capacitors 141, 142, 143, 144, due to the doubled distance 2*D. Referring to the above example, each of these two unit capacitors has a capacitance of 0.05 fF. As such, the second reference capacitor has a capacitance of 0.1 fF. Compared to the second reference capacitor, the parallel-series connected capacitor 150 with inserted dummy metal has a greater metal density and a same capacitance. That is, compared to increasing empty distance between electrodes, inserting dummy metal can avoid decreasing metal density in the circuit.

Figure 2:
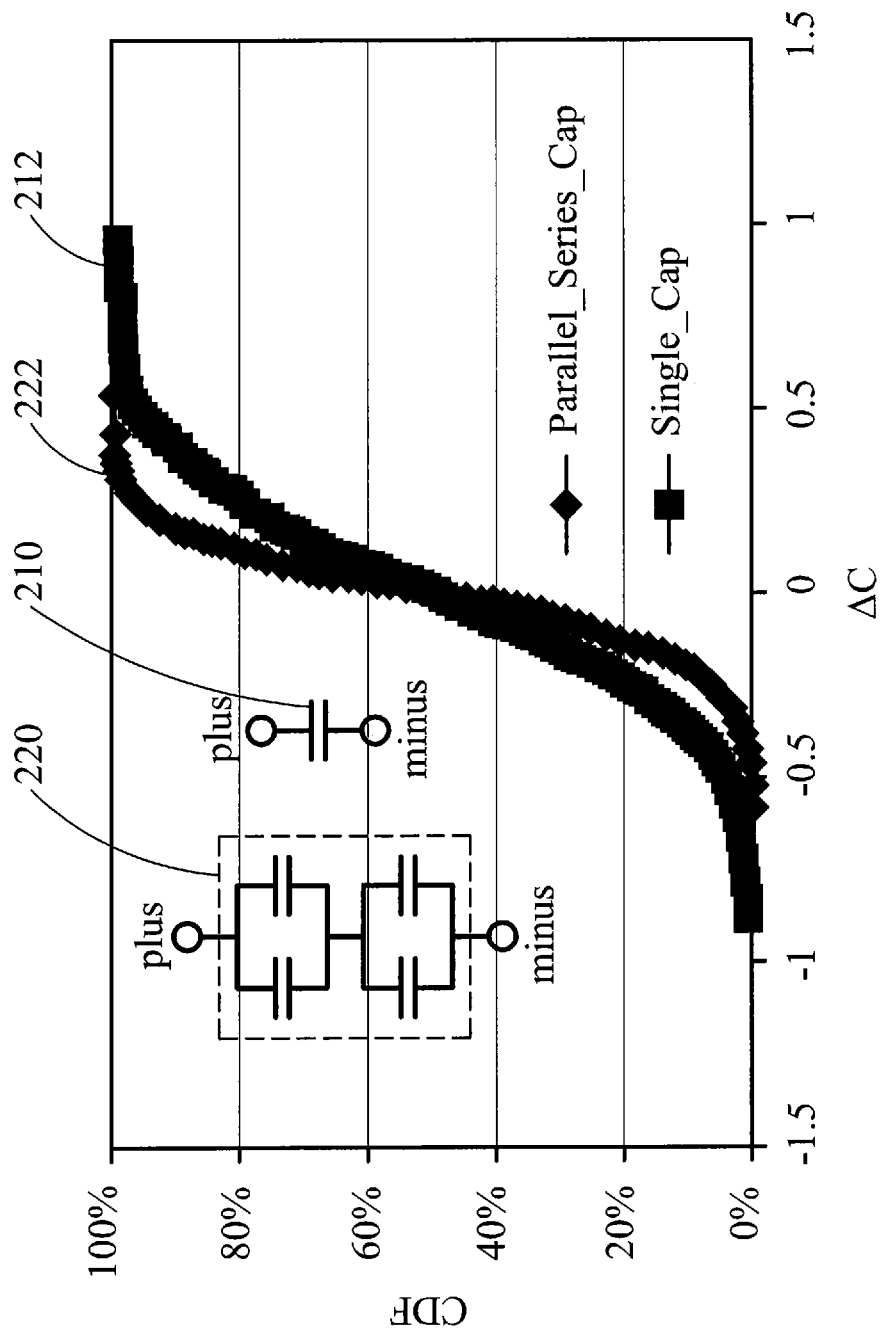
FIG. 2 illustrates a comparison of mismatch performances of exemplary capacitor structures.

FIG. 2 illustrates a comparison of mismatch performances of exemplary capacitor structures. As shown in FIG. 2, a single-capacitor cell 210 has a single unit capacitor without any parallel or series connection. In contrast, FIG. 2 also shows a parallel-series connected capacitor cell 220 that includes two groups of unit capacitors. Each group includes two unit capacitors connected in parallel. The two groups are connected in series. When each unit capacitor in the parallel-series connected capacitor cell 220 has a same structure as that of the single-capacitor cell 210, the parallel-series connected capacitor cell 220 has a same reference capacitance as the single-capacitor cell 210. That is, when each of the single-capacitor cell 210 and the parallel-series connected capacitor cell 220 is replicated for enough number of copies, their two respective distributions will have a same average mean capacitance. But the two distributions will have different standard deviations.

FIG. 2 shows two distributions: a first distribution 212 of capacitance differences of copies of the single-capacitor cell 210 relative its average mean capacitance, and a second distribution 222 of capacitance differences of copies of the parallel-series connected capacitor cell 220 relative its average mean capacitance. As shown in FIG. 2, the second distribution 222 is more focused around its average mean capacitance that the first distribution 212. This shows that the second distribution 222 has a smaller standard deviation than the first distribution 212. As such, the parallel-series connected capacitor cell 220 has a better matching performance than the single-capacitor cell 210. This is because a mismatch of a capacitor is inversely proportional to a square root (sqrt) of the area of the capacitor for a parallel structure and multiplicative for a serial structure. As each group in the parallel-series connected capacitor cell 220 has two unit capacitors connected in parallel, the mismatch of each group is a product of 1/sqrt(2) and the mismatch of the unit capacitor, i.e. a product of 1/sqrt(2) and the mismatch of the single-capacitor cell 210. In addition, because the two groups in the parallel-series connected capacitor cell 220 are connected in series, the mismatch of the parallel-series connected capacitor cell 220 is a product of ½ (1/sqrt(2)*1/sqrt(2)) and the mismatch of the unit capacitor, i.e. half of the mismatch of the single-capacitor cell 210. Specifically, in this example, the single-capacitor cell 210 has a standard deviation of about 0.29, while the parallel-series connected capacitor cell 220 has a standard deviation of about 0.15.

In general, as shown in FIG. 2, a compound capacitor formed by multiple single capacitors connected in series and/or in parallel can improve the mismatch performance compared to a single unit capacitor that has a same total capacitance as the compound capacitor. Referring back to FIG. 1B, where the parallel-series connected capacitor 150 includes two groups of unit capacitors. Each group includes two unit capacitors connected in series, and while the two groups are connected in parallel. As discussed before, a mismatch of a capacitor is inversely proportional to a square root (sqrt) of the area of the capacitor for a parallel structure and multiplicative for a serial structure. As such, the mismatch of the parallel-series connected capacitor 150 is 1/sqrt(2) times the mismatch of the unit capacitor, i.e. about 29% smaller than the mismatch of the unit capacitor.

Figure 3:
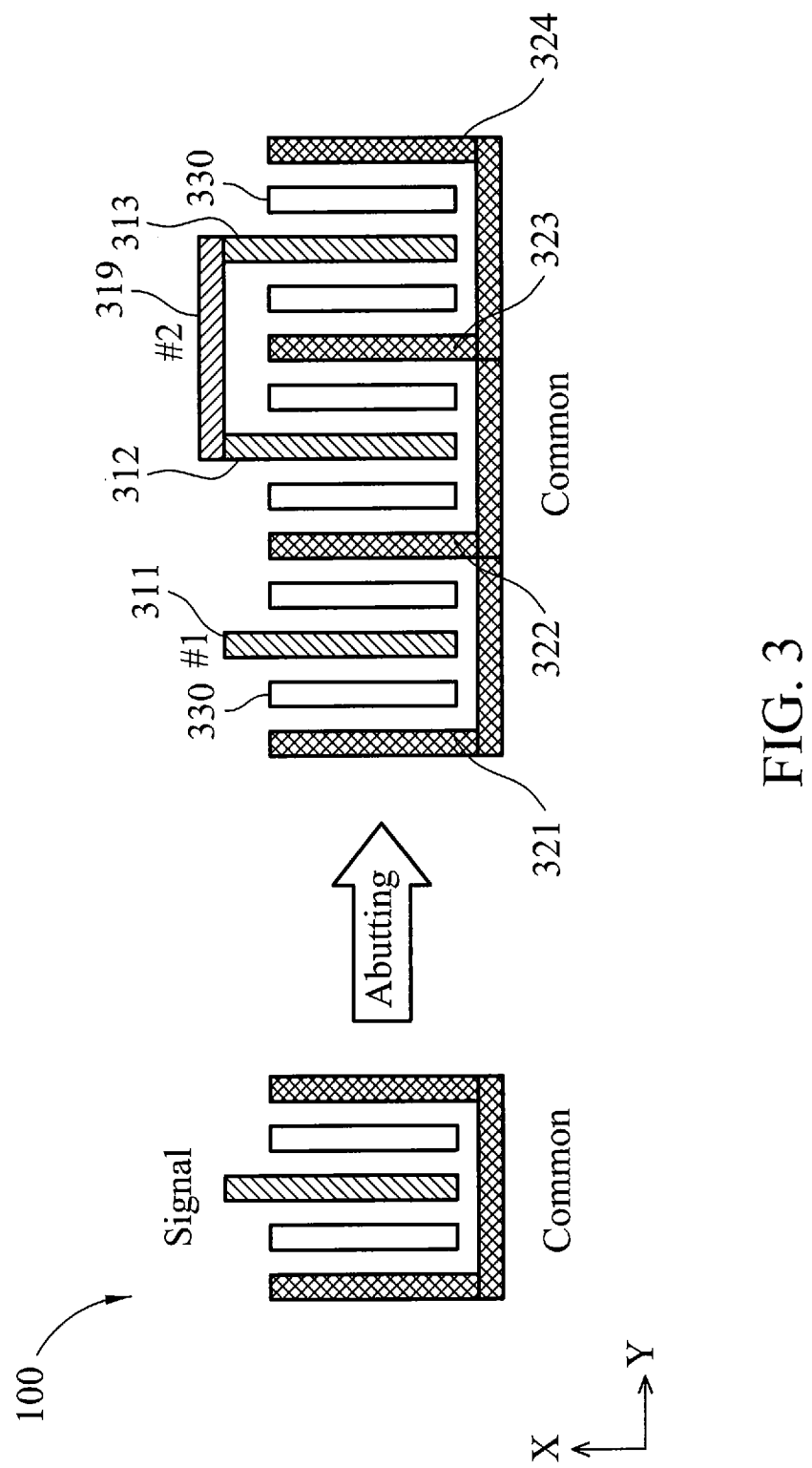
FIG. 3 illustrates an abutting performance of an exemplary capacitor structure, in accordance with some embodiments of the present disclosure.

FIG. 3 illustrates an abutting performance of an exemplary capacitor structure 100, in accordance with some embodiments of the present disclosure. As shown in FIG. 3, multiple capacitors each having the capacitor structure 100 can be abutted one after another along a Y direction to form a capacitor array, by sharing a common metal finger among two neighboring capacitors. As discussed above, the capacitor structure 100 includes a signal electrode having a single metal finger, and a common electrode having two side metal fingers coupled to a bus line. For example, the capacitor array in FIG. 3 includes three capacitors each having the capacitor structure 100 and adjacent to one another along the Y direction. Among the three capacitors, the left capacitor has a signal electrode having a single metal finger 311, and a common electrode having two side metal fingers 321, 322; the middle capacitor has a signal electrode having a single metal finger 312, and a common electrode having two side metal fingers 322, 323; and the right capacitor has a signal electrode having a single metal finger 313, and a common electrode having two side metal fingers 323, 324. As shown in FIG. 3, each pair of neighboring capacitors shares a side metal finger. For example, the left and the middle capacitors are sharing the side metal finger 322; the middle and the right capacitors are sharing the side metal finger 323. In addition, the three capacitors are sharing a common bus line that is coupled to all side metal fingers of the three capacitors, such that the three capacitors share a common electrode. With this capacitor structure, it is easy to abut multiple capacitors without a need of any extra metal line or any extra area for the abutting.

As shown in FIG. 3, each capacitor includes some dummy metal fingers 330 inserted between the signal electrode and the common electrode. This can help to reduce the capacitance of the capacitor array without reducing a metal density of the capacitor array along the Y direction. Furthermore, two signal electrodes 312, 313 may be coupled to each other via a metal line 319 according to a design rule.

Figure 4:
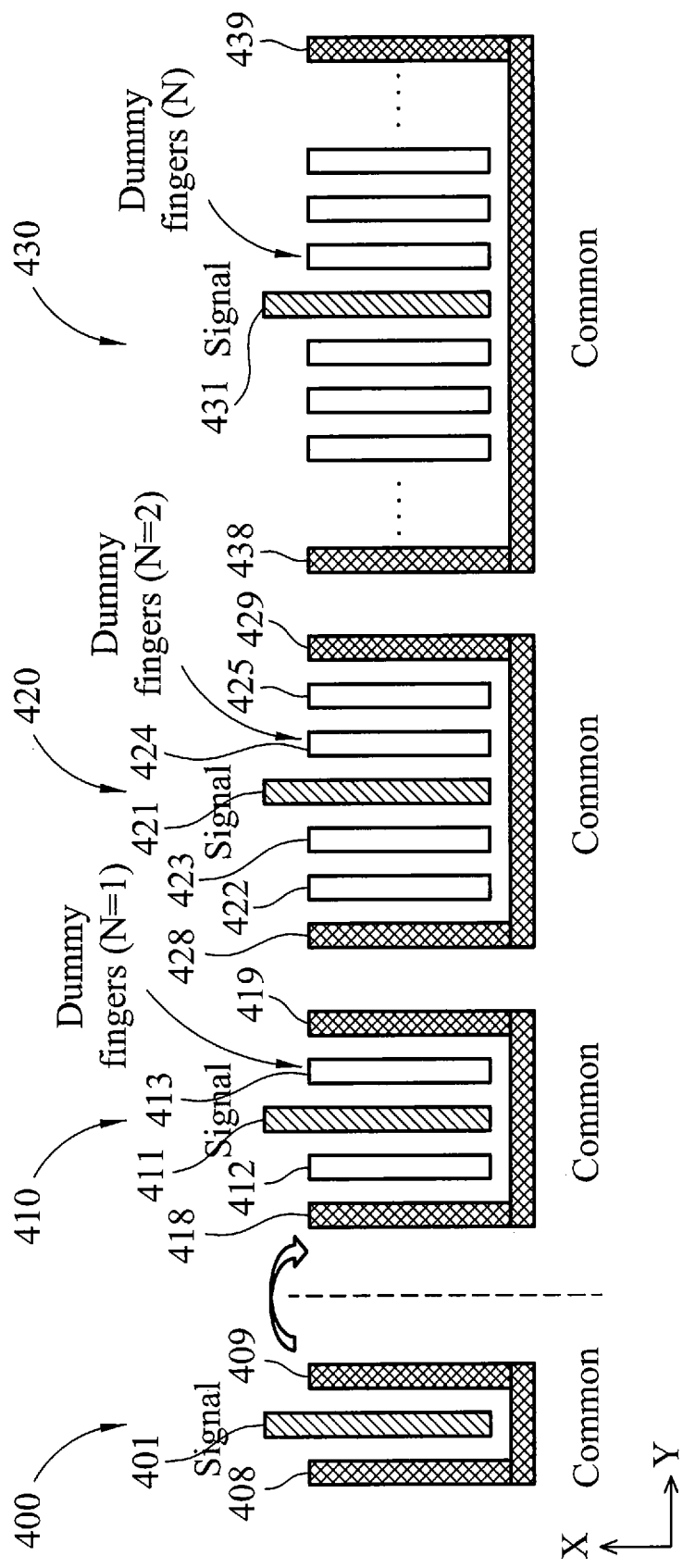
FIG. 4 illustrates cross-sectional views of various exemplary capacitor structures, in accordance with some embodiments of the present disclosure.

FIG. 4 illustrates cross-sectional views of various exemplary capacitor structures, in accordance with some embodiments of the present disclosure. As shown in FIG. 4, a reference capacitor 400 has a signal electrode having a single metal finger 401, and a common electrode having two side metal fingers 408, 409. The single metal finger 401 is formed in the middle between the two side metal fingers 408, 409, and is parallel to the two side metal fingers 408, 409. The reference capacitor 400 in this example has a same space between the single metal finger 401 and the side metal finger 408, as the space between the single metal finger 401 and the side metal finger 409. The space between two neighboring fingers may be referred to as a finger-to-finger space.

In contrast to the reference capacitor 400, FIG. 4 shows various capacitor structures 410, 420, 430 each of which has at least one dummy metal finger inserted between the two electrodes. The capacitor structure 410 has a signal electrode having a single metal finger 411, a common electrode having two side metal fingers 418, 419, and dummy metal fingers 412, 413 each being inserted between the two electrodes. Specifically, the dummy metal finger 412 is formed in the middle between the single metal finger 411 and the side metal finger 418; while the dummy metal finger 413 is formed in the middle between the single metal finger 411 and the side metal finger 419. As such, the capacitor structure 410 has one dummy metal finger inserted on each side of the signal electrode. With this dummy metal insertion, the capacitor structure 410 has a lower capacitance compared to that of the reference capacitor 400. In addition, as shown in FIG. 4, the capacitor structure 410 has a same finger-to-finger space as that of the reference capacitor 400, to keep a same metal density as that of the reference capacitor 400 along the Y direction.

The capacitor structure 420 has a signal electrode having a single metal finger 421, a common electrode having two side metal fingers 428, 429, and dummy metal fingers 422, 423, 424, 425 each being inserted between the two electrodes. Specifically, the dummy metal fingers 422, 423 are formed between the single metal finger 421 and the side metal finger 428; while the dummy metal fingers 424, 425 are formed between the single metal finger 421 and the side metal finger 429. As such, the capacitor structure 420 has two dummy metal fingers inserted on each side of the signal electrode to further lower the capacitance compared to that of the reference capacitor 400. In addition, the capacitor structure 420 has a same finger-to-finger space as that of the reference capacitor 400, to keep a same metal density as that of the reference capacitor 400 along the Y direction.

A general capacitor structure 430, as shown in FIG. 4, has a signal electrode having a single metal finger 431, a common electrode having two side metal fingers 438, 439, and N dummy metal fingers inserted on each side of the signal electrode to lower the capacitance compared to that of the reference capacitor 400. Similar to the capacitor structure 410 and the capacitor structure 420, the capacitor structure 430 still has a same finger-to-finger space as that of the reference capacitor 400, to keep a same metal density as that of the reference capacitor 400 along the Y direction. In general, because a capacitance of a capacitor is inversely proportional to the spacing or distance between the two electrodes, the capacitance of the capacitor structure 430 is inversely proportional to (N+1), where N is the number of dummy metal fingers inserted on each side of the signal electrode, with a given finger-to-finger space.

Figure 5:
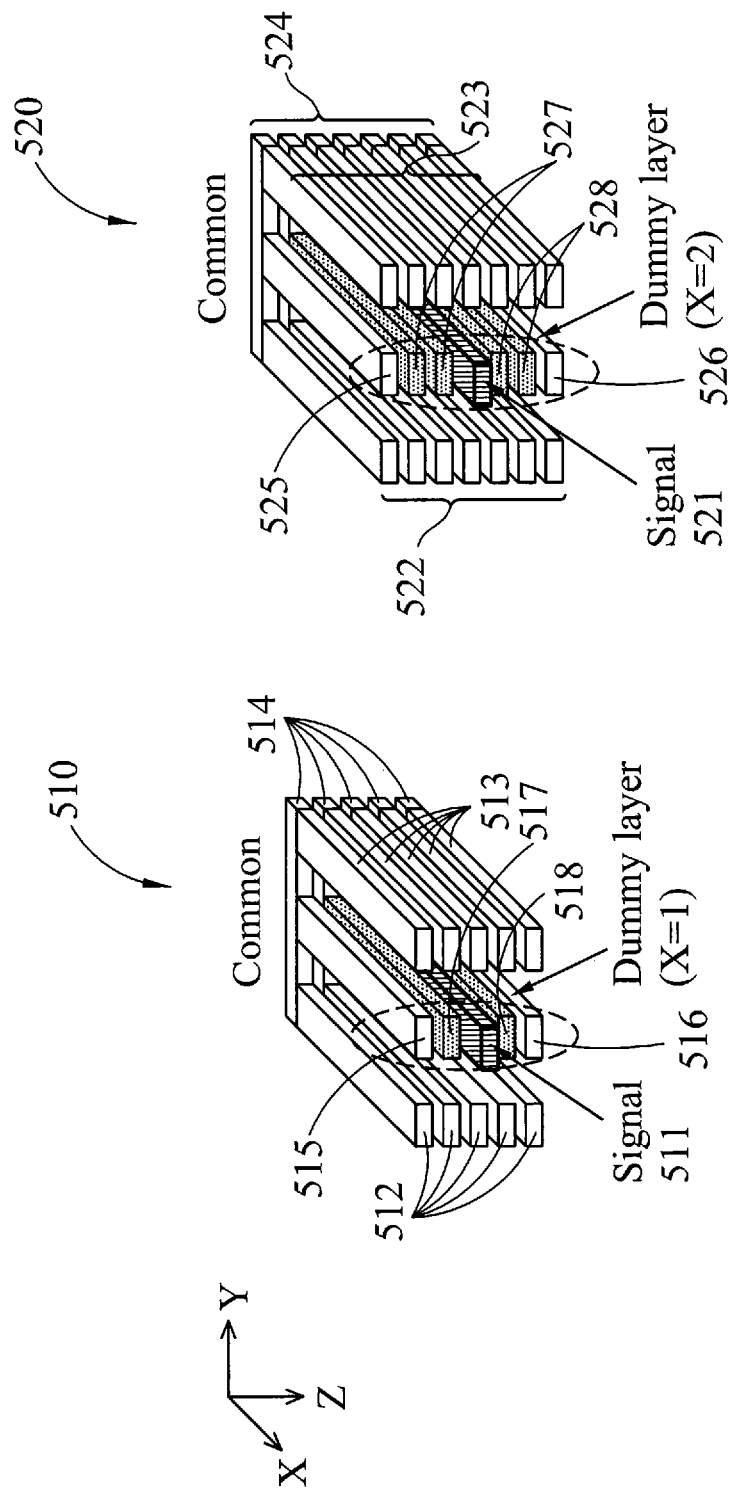
FIG. 5 illustrates perspective views of various exemplary capacitor structures, in accordance with some embodiments of the present disclosure.

FIG. 5 illustrates perspective views of various exemplary capacitor structures, in accordance with some embodiments of the present disclosure. While the dummy metal insertion may be performed along a horizontal direction as shown in FIG. 4, it may also be performed along a vertical direction as shown in FIG. 5. FIG. 5 shows multi-layer capacitor structures 510, 520, each of which includes a plurality of finger layers arranged along a vertical direction, e.g. the Z direction in FIG. 5. As shown in FIG. 5, the multi-layer capacitor structure 510 includes a signal electrode having a single metal finger 511 in one layer, and a common electrode having metal fingers on multiple layers. The multi-layer capacitor structure 510 in this example has five layers including a top layer, a bottom layer, and three middle layers between the top layer and the bottom layer. At each layer, the common electrode of the multi-layer capacitor structure 510 has two side metal fingers: a first side metal finger 512 and a second side metal finger 513. As such, all first side metal fingers 512 form a first side-wall of the multi-layer capacitor structure 510; and all second side metal fingers 513 form a second side-wall of the multi-layer capacitor structure 510. The common electrode of the multi-layer capacitor structure 510 also includes a plurality of bus lines 514 each of which corresponds to a respective layer of the multi-layer capacitor structure 510; such that the bus lines 514 of all layers form a bus-wall of the multi-layer capacitor structure 510. At each layer, the first side metal finger 512 and the second side metal finger 513 are coupled to the bus line 514 on that layer. While each metal finger in the multi-layer capacitor structure 510 extends along an X direction, the bus lines 514 extend along a Y direction that is orthogonal to the X direction. In one embodiment, the bus lines 514 of all layers are coupled to each other.

At the top layer, the multi-layer capacitor structure 510 also includes a middle metal finger 515 coupled to the bus line corresponding to the top layer. At the bottom layer, the multi-layer capacitor structure 510 also includes a middle metal finger 516 coupled to the bus line corresponding to the bottom layer. The three middle layers in the multi-layer capacitor structure 510 are ordered from the first middle layer to the third middle layer, from top down along the Z direction. The single metal finger 511 of the signal electrode is formed as a middle metal finger between the two side metal fingers 512, 513 at the second middle layer. The first middle layer also includes a middle dummy metal finger 517 between the two side metal fingers 512, 513. The third middle layer also includes a middle dummy metal finger 518 between the two side metal fingers 512, 513. The first and third middle layers may be referred to as dummy layers that include dummy metal fingers. The dummy metal fingers 517, 518 are not connected to the signal electrode or the common electrode.

All the metal fingers in the multi-layer capacitor structure 510 are parallel to each other. As such, the single metal finger 511 of the signal electrode, the middle dummy metal finger 517, and the middle metal finger 515 form two sub-capacitors connected in series along the vertical Z direction; the single metal finger 511 of the signal electrode, the middle dummy metal finger 518, and the middle metal finger 516 form two sub-capacitors connected in series along the vertical Z direction.

In one embodiment, the distance between each pair of neighboring metal fingers at each layer, i.e. along the Y direction, in the multi-layer capacitor structure 510 is the same and minimized for saving circuit area. In another embodiment, the distance between each pair of neighboring metal fingers cross layers, i.e. along the Z direction, in the multi-layer capacitor structure 510 is the same and minimized for saving circuit area. The minimization of the distance means control the distance to be less than a predetermined threshold according to a design rule.

The multi-layer capacitor structure 520 in FIG. 5 includes a signal electrode having a single metal finger 521 in one layer, and a common electrode having metal fingers on multiple layers. The multi-layer capacitor structure 520 in this example has seven layers including a top layer, a bottom layer, and five middle layers between the top layer and the bottom layer. At each layer, the common electrode of the multi-layer capacitor structure 520 has two side metal fingers: a first side metal finger 522 and a second side metal finger 523. As such, all first side metal fingers 522 form a first side-wall of the multi-layer capacitor structure 520; and all second side metal fingers 523 form a second side-wall of the multi-layer capacitor structure 520. The common electrode of the multi-layer capacitor structure 520 also includes a plurality of bus lines 524 each of which corresponds to a respective layer of the multi-layer capacitor structure 520; such that the bus lines 524 of all layers form a bus-wall of the multi-layer capacitor structure 520. At each layer, the first side metal finger 522 and the second side metal finger 523 are coupled to the bus line 524 on that layer. While each metal finger in the multi-layer capacitor structure 520 extends along the X direction, the bus lines 524 extend along the Y direction that is orthogonal to the X direction. In one embodiment, the bus lines 524 of all layers are coupled to each other.

At the top layer, the multi-layer capacitor structure 520 also includes a middle metal finger 525 coupled to the bus line corresponding to the top layer. At the bottom layer, the multi-layer capacitor structure 520 also includes a middle metal finger 526 coupled to the bus line corresponding to the bottom layer. The five middle layers in the multi-layer capacitor structure 520 are ordered from the first middle layer to the fifth middle layer, from top down along the Z direction. The single metal finger 521 of the signal electrode is formed as a middle metal finger between the two side metal fingers 522, 523 at the third middle layer. Each of the first middle layer and the second middle layer includes a middle dummy metal finger 527 between the two side-walls 522, 523. Each of the fourth middle layer and the fifth middle layer includes a middle dummy metal finger 528 between the two side-walls 522, 523. All middle layers except the third middle layer may be referred to as dummy layers that include dummy metal fingers. The dummy metal fingers 527, 528 are not connected to the signal electrode or the common electrode.

All the metal fingers in the multi-layer capacitor structure 520 are parallel to each other. As such, the single metal finger 521 of the signal electrode, the two middle dummy metal fingers 527, and the middle metal finger 525 form three sub-capacitors connected in series along the vertical direction Z; the single metal finger 521 of the signal electrode, the two middle dummy metal fingers 528, and the middle metal finger 526 form three sub-capacitors connected in series along the vertical direction Z.

In one embodiment, the distance between each pair of neighboring metal fingers at each layer, i.e. along the Y direction, in the multi-layer capacitor structure 520 is the same and minimized for saving circuit area. In another embodiment, the distance between each pair of neighboring metal fingers cross layers, i.e. along the Z direction, in the multi-layer capacitor structure 520 is the same and minimized for saving circuit area. The minimization of the distance means control the distance to be less than a predetermined threshold according to a design rule. In general, because a capacitance of a capacitor is inversely proportional to the spacing or distance between the two electrodes, the capacitance of the multi-layer capacitor structure 510 or the multi-layer capacitor structure 520 is inversely proportional to (X+1), where X is the number of dummy layers inserted on each side of the signal electrode along the Z direction, with a given finger-to-finger space along the Z direction. For example, X=1 for the multi-layer capacitor structure 510; and X=2 for the multi-layer capacitor structure 520. In some embodiments, in each of the multi-layer capacitor structure 510 and the multi-layer capacitor structure 520, the metal fingers are separated by a dielectric medium having a material made of at least one of: glass, ceramic, plastic film, paper, mica, and oxide layers.

Figure 6A:
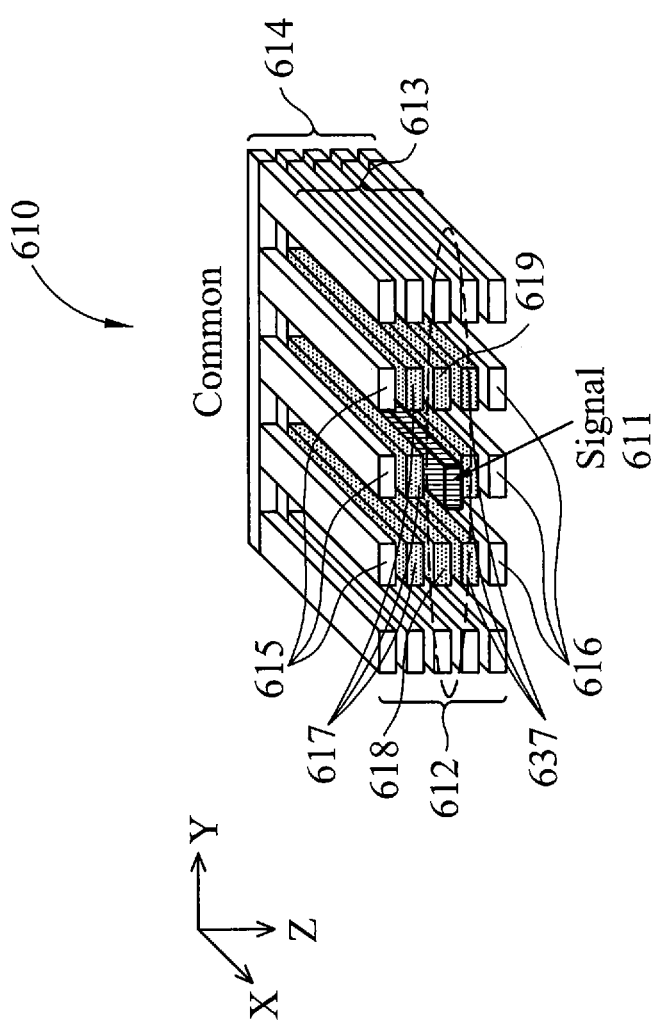
FIG. 6A is a perspective view of an exemplary capacitor structure, in accordance with some embodiments of the present disclosure.

FIG. 6A is a perspective view of an exemplary capacitor structure 610, in accordance with some embodiments of the present disclosure. As shown in FIG. 6A, the dummy metal insertion may be performed both along a horizontal direction and along a vertical direction. FIG. 6A shows a multi-layer capacitor structure 610 including a plurality of finger layers arranged along a vertical direction, e.g. the Z direction in FIG. 6A. As shown in FIG. 6A, the multi-layer capacitor structure 610 includes a signal electrode having a single metal finger 611 in one layer, and a common electrode having metal fingers on multiple layers. The multi-layer capacitor structure 610 in this example has five layers including a top layer, a bottom layer, and three middle layers between the top layer and the bottom layer. At each layer, the common electrode of the multi-layer capacitor structure 610 has two side metal fingers: a first side metal finger 612 and a second side metal finger 613. As such, all first side metal fingers 612 form a first side-wall of the multi-layer capacitor structure 610; and all second side metal fingers 613 form a second side-wall of the multi-layer capacitor structure 610. The common electrode of the multi-layer capacitor structure 610 also includes a plurality of bus lines 614 each of which corresponds to a respective layer of the multi-layer capacitor structure 610; such that the bus lines 614 of all layers form a bus-wall of the multi-layer capacitor structure 610. At each layer, the first side metal finger 612 and the second side metal finger 613 are coupled to the bus line 614 on that layer. While each metal finger in the multi-layer capacitor structure 610 extends along a direction X, the bus lines 614 extend along a direction Y that is orthogonal to the X direction. In one embodiment, the bus lines 614 of all layers are coupled to each other.

At the top layer, besides the two side metal fingers 612, 613, the multi-layer capacitor structure 610 also includes three middle metal fingers 615 coupled to the bus line corresponding to the top layer. At the bottom layer, besides the two side metal fingers 612, 613, the multi-layer capacitor structure 610 also includes three middle metal fingers 616 coupled to the bus line corresponding to the bottom layer. The three middle layers in the multi-layer capacitor structure 610 are ordered from the first middle layer to the third middle layer, from top down along the Z direction. Besides the two side metal fingers 612, 613, the second middle layer also includes the single metal finger 611 of the signal electrode between the two side metal fingers 612, 613. In addition, the second middle layer also includes: a middle dummy metal finger 618 formed between the single metal finger 611 and the side metal finger 612; and a middle dummy metal finger 619 formed between the single metal finger 611 and the side metal finger 613. As such, the single metal finger 611 of the signal electrode, the middle dummy metal finger 618, and the side metal finger 612 at the second middle layer form two sub-capacitors connected in series along the horizontal direction Y; the single metal finger 611 of the signal electrode, the middle dummy metal finger 619, and the side metal finger 613 at the second middle layer form two sub-capacitors connected in series along the horizontal direction Y.

Besides the two side metal fingers 612, 613, the first middle layer also includes three middle dummy metal fingers 617 formed between the two side metal fingers 612, 613. As such, the single metal finger 611 of the signal electrode, one of the three middle dummy metal fingers 617 at the first middle layer, and one of the three middle metal fingers 615 at the top layer form two sub-capacitors connected in series along the vertical Z. Besides the two side metal fingers 612, 613, the third middle layer also includes three middle dummy metal fingers 637 formed between the two side metal fingers 612, 613. As such, the single metal finger 611 of the signal electrode, one of the three middle dummy metal fingers 637 at the third middle layer, and one of the three middle metal fingers 616 at the bottom layer form two sub-capacitors connected in series along the vertical Z. The first and third middle layers may be referred to as dummy layers that include dummy metal fingers. The dummy metal fingers 617, 618, 619, 637 are not connected to the signal electrode or the common electrode. All the metal fingers in the multi-layer capacitor structure 610 are parallel to each other.

In one embodiment, the distance between each pair of neighboring metal fingers at each layer, i.e. along the Y direction, in the multi-layer capacitor structure 610 is the same and minimized for saving circuit area. In another embodiment, the distance between each pair of neighboring metal fingers cross layers, i.e. along the Z direction, in the multi-layer capacitor structure 610 is the same and minimized for saving circuit area. The minimization of the distance means control the distance to be less than a predetermined threshold according to a design rule. In some embodiments, the metal fingers in the multi-layer capacitor structure 610 are separated by a dielectric medium having a material made of at least one of: glass, ceramic, plastic film, paper, mica, and oxide layers.

Figure 6B:
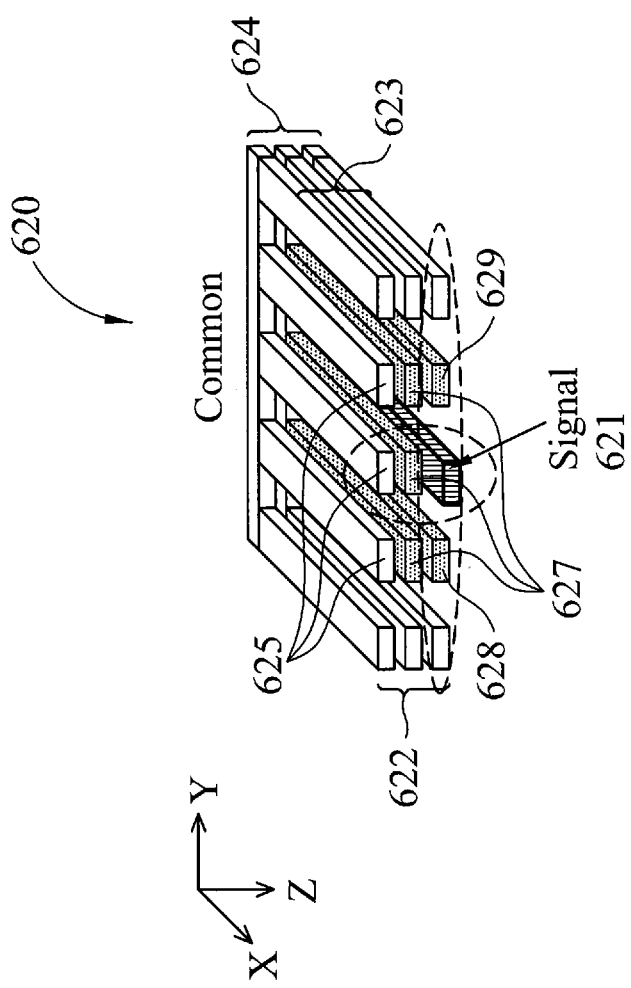
FIG. 6B is a perspective view of another exemplary capacitor structure, in accordance with some embodiments of the present disclosure.

FIG. 6B is a perspective view of another exemplary capacitor structure 620, in accordance with some embodiments of the present disclosure. FIG. 6B shows a multi-layer capacitor structure 620 including a plurality of finger layers arranged along a vertical direction, e.g. the Z direction in FIG. 6B. As shown in FIG. 6B, the multi-layer capacitor structure 620 includes a signal electrode having a single metal finger 621 in one layer, and a common electrode having metal fingers on multiple layers. The multi-layer capacitor structure 620 in this example has three layers including a top layer, a bottom layer, and a middle layer between the top layer and the bottom layer. At each layer, the common electrode of the multi-layer capacitor structure 620 has two side metal fingers: a first side metal finger 622 and a second side metal finger 623. As such, all first side metal fingers 622 form a first side-wall of the multi-layer capacitor structure 620; and all second side metal fingers 623 form a second side-wall of the multi-layer capacitor structure 620. The common electrode of the multi-layer capacitor structure 620 also includes a plurality of bus lines 624 each of which corresponds to a respective layer of the multi-layer capacitor structure 620; such that the bus lines 624 of all layers form a bus-wall of the multi-layer capacitor structure 620. At each layer, the first side metal finger 622 and the second side metal finger 623 are coupled to the bus line 624 on that layer. While each metal finger in the multi-layer capacitor structure 620 extends along a direction X, the bus lines 624 extend along a direction Y that is orthogonal to the X direction. In one embodiment, the bus lines 624 of all layers are coupled to each other.

At the top layer, besides the two side metal fingers 622, 623, the multi-layer capacitor structure 620 also includes three middle metal fingers 625 coupled to the bus line corresponding to the top layer. Besides the two side metal fingers 622, 623, the bottom layer also includes the single metal finger 621 of the signal electrode between the two side metal fingers 622, 623. In addition, the bottom layer also includes: a middle dummy metal finger 628 formed between the single metal finger 621 and the side metal finger 622; and a middle dummy metal finger 629 formed between the single metal finger 621 and the side metal finger 623. As such, the single metal finger 621 of the signal electrode, the middle dummy metal finger 628, and the side metal finger 622 at the bottom layer form two sub-capacitors connected in series along the horizontal direction Y; the single metal finger 621 of the signal electrode, the middle dummy metal finger 629, and the side metal finger 623 at the bottom layer form two sub-capacitors connected in series along the horizontal direction Y.

Besides the two side metal fingers 622, 623, the middle layer also includes three middle dummy metal fingers 627 formed between the two side metal fingers 622, 623. As such, the single metal finger 621 of the signal electrode, one of the three middle dummy metal fingers 627 at the middle layer, and one of the three middle metal fingers 625 at the top layer form two sub-capacitors connected in series along the vertical Z. The dummy metal fingers 627, 628, 629 are not connected to the signal electrode or the common electrode. All the metal fingers in the multi-layer capacitor structure 620 are parallel to each other. In one embodiment, the distance between each pair of neighboring metal fingers at each layer, i.e. along the Y direction, in the multi-layer capacitor structure 620 is the same and minimized for saving circuit area. In another embodiment, the distance between each pair of neighboring metal fingers cross layers, i.e. along the Z direction, in the multi-layer capacitor structure 620 is the same and minimized for saving circuit area. The minimization of the distance means control the distance to be less than a predetermined threshold according to a design rule. In some embodiments, the metal fingers in the multi-layer capacitor structure 620 are separated by a dielectric medium having a material made of at least one of: glass, ceramic, plastic film, paper, mica, and oxide layers.

Compared to the multi-layer capacitor structure 610 in FIG. 6A, the multi-layer capacitor structure 620 in FIG. 6B has an open bottom layer where the signal electrode is not covered by any other metal under the signal electrode. Due to the open bottom layer, the multi-layer capacitor structure 620 has a smaller parasitic capacitance than that of the multi-layer capacitor structure 610. In addition, it is easier for the multi-layer capacitor structure 620 to be routed or connected to other components in the integrated circuit, compared to the multi-layer capacitor structure 610. On the other hand, the multi-layer capacitor structure 610 has a better protection of the signal electrode and a better confinement of electric-magnetic field within the capacitor, compared to the multi-layer capacitor structure 620, due to a full coverage of metal fingers around the signal electrode in the multi-layer capacitor structure 610. In various embodiments, a multi-layer capacitor structure as disclosed herein may have an open bottom layer, an open top layer, or both.

Figure 7:
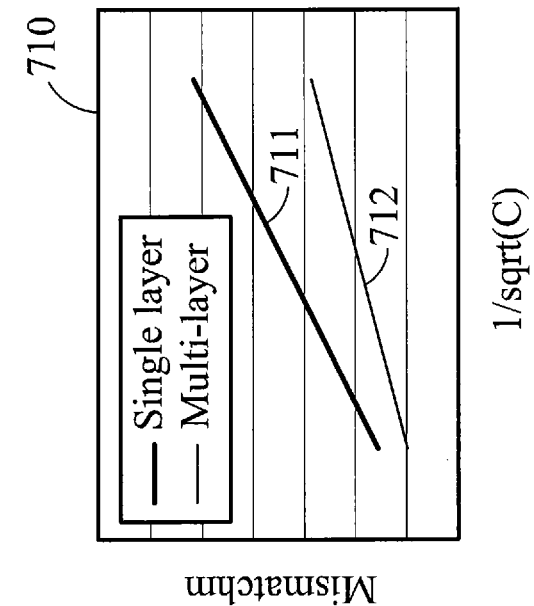
FIG. 7 illustrates a comparison of mismatch performances of different exemplary capacitor structures, in accordance with some embodiments of the present disclosure.
Figure 7:
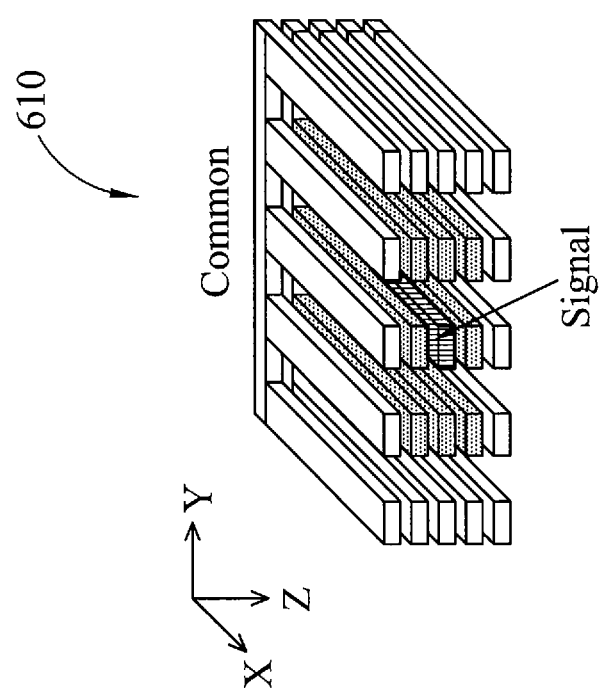

FIG. 7 illustrates a comparison of mismatch performances of different exemplary capacitor structures, in accordance with some embodiments of the present disclosure. For a multi-layer capacitor structure 610, the number of layers in the capacitor can impact the mismatch performance of the capacitor. As shown in the plot 710, a multi-layer capacitor will have a better or smaller mismatch 712 than the mismatch 711 of a single-layer capacitor, for any given capacitance. The multi-layer capacitor here refers to a capacitor like the multi-layer capacitor structure 610; while the single-layer capacitor refers to a capacitor having all metal fingers of the signal electrode and the common electrode included in a same single layer. That is, when a single-layer capacitor and a multi-layer capacitor have a same capacitance C, the multi-layer capacitor will have a better mismatch performance than the single-layer capacitor.

Figure 8:
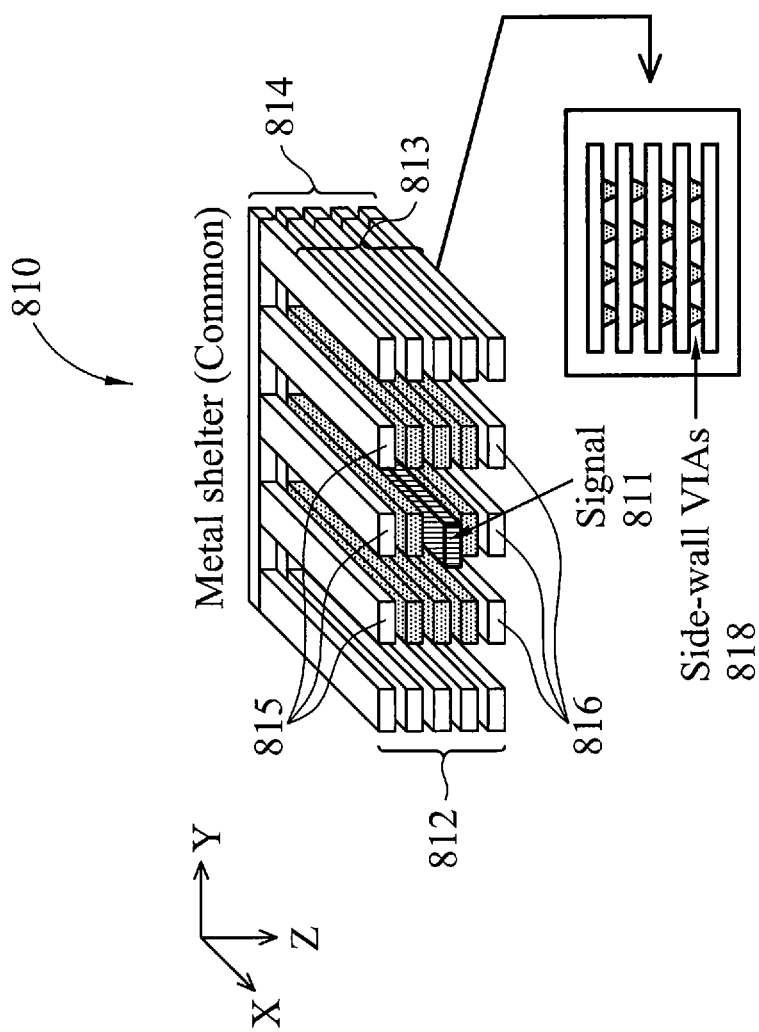
FIG. 8 is a perspective view of an exemplary capacitor structure for confining electric-magnetic field, in accordance with some embodiments of the present disclosure.

FIG. 8 is a perspective view of an exemplary capacitor structure 810 for confining electric-magnetic field, in accordance with some embodiments of the present disclosure. Similar to the multi-layer capacitor structure 610 in FIG. 6A, the multi-layer capacitor structure 810 includes a plurality of finger layers arranged along a vertical direction, e.g. the Z direction in FIG. 8. The multi-layer capacitor structure 810 in this example has five layers including a top layer, a bottom layer, and three middle layers between the top layer and the bottom layer. The multi-layer capacitor structure 810 has a signal electrode 811 covered by a first side-wall 812 from one side, by a second side-wall 813 from the other side, by the top layer from the top side, by the bottom layer from the bottom side, and by a bus-wall 814 from the back side. As such, the multi-layer capacitor structure 810 creates a metal shelter formed by the metal fingers and bus lines of the common electrode, to protect the signal electrode. In addition, compared to the multi-layer capacitor structure 610 in FIG. 6A, the multi-layer capacitor structure 810 includes one or more side-wall vias 818 passing through the multiple layers along the Z direction on each of the side-walls 812, 813. In some embodiments, the multi-layer capacitor structure 810 may also include one or more vias passing through the multiple layers along the Z direction on the bus-wall 814. In some embodiments, the multi-layer capacitor structure 810 may also include one or more vias passing through the metal fingers along the Y direction on the top layer 815 and/or the bottom layer 816. The vias may be metal lines that can help to confine electric-magnetic field within the multi-layer capacitor structure 810 and reduce fringe effect of the multi-layer capacitor structure 810.

Figure 9:
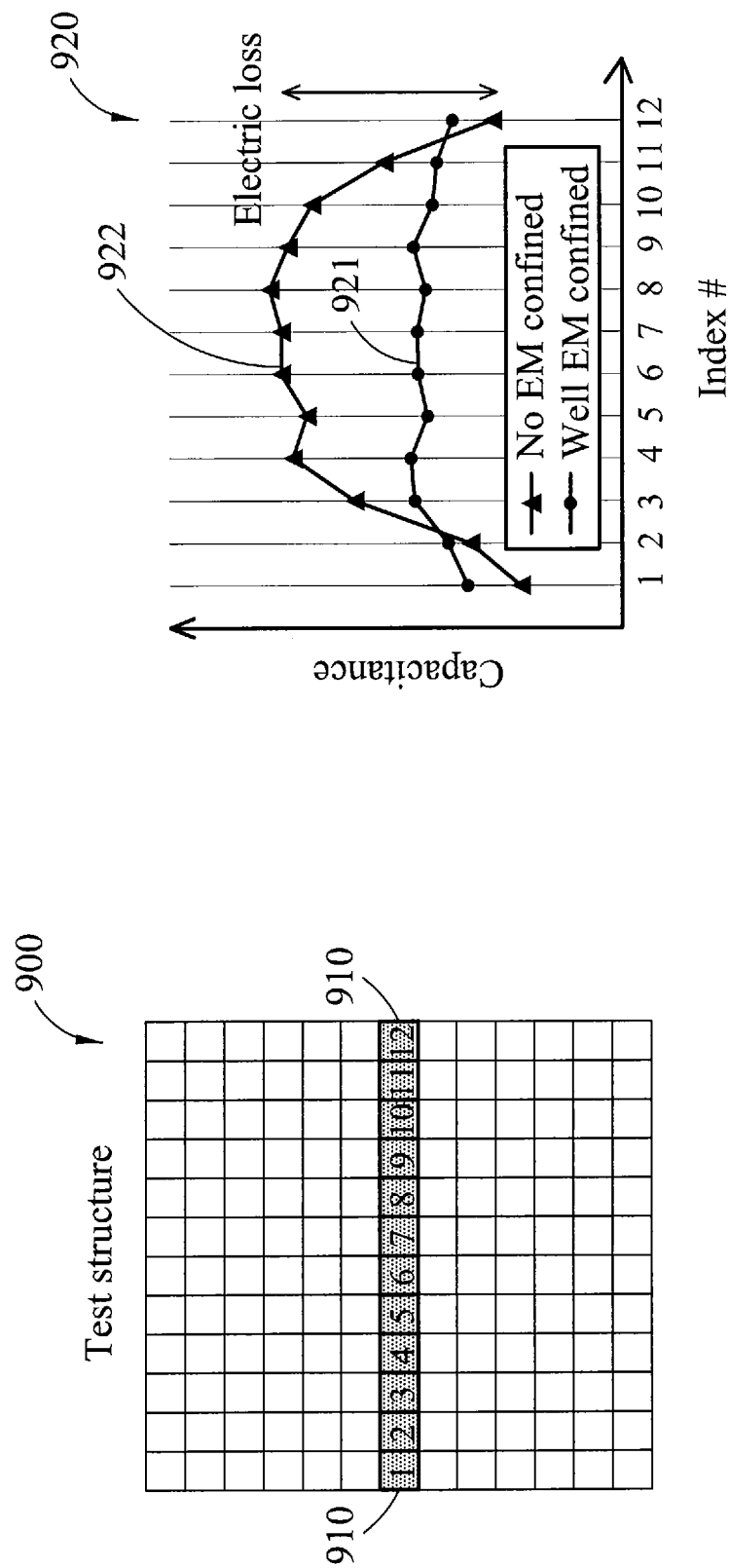
FIG. 9 illustrates a test result regarding electric-magnetic field confining using an exemplary capacitor structure, in accordance with some embodiments of the present disclosure.

FIG. 9 illustrates a test result regarding electric-magnetic field confining using an exemplary capacitor structure, in accordance with some embodiments of the present disclosure. According to the test structure 900, a plurality of capacitor cells 910 are arranged in an array. In a first example, each of the capacitor cells 910 has a same structure as the multi-layer capacitor structure 810 in FIG. 8, where electric-magnetic field is well confined. In a second example, each of the capacitor cells 910 has a structure such that no protection to confine the electric-magnetic field. For example, the capacitor cell 910 in the second example may have a structure like the multi-layer capacitor structure 810 but without any via, or even without the top and bottom layers. FIG. 9 shows a comparison 920 of capacitance distributions of two capacitor arrays having capacitor cell structures following the first and second examples respectively. Specifically, the capacitance distribution 921 corresponds to a capacitor array having capacitor cell structures following the first example; and the capacitance distribution 922 corresponds to a capacitor array having capacitor cell structures following the second example. As shown in FIG. 9, the capacitance distribution 921 shows a smaller electric-magnetic loss at the edge of the capacitor array, compared to the capacitance distribution 922. This is because the capacitor cell structure corresponding to the first example, like the multi-layer capacitor structure 810, can confine the electric-magnetic field within each capacitor cell, to reduce fringe or edge effect at the cell level. Therefore, unlike the second example, a capacitor cell at the array edge following the first example will not have a big capacitance drop, due to a big electric-magnetic loss, compared to a capacitor cell at the array center. Accordingly, as shown in FIG. 9, the capacitance distribution 921 shows a less variation of capacitances of capacitor cells across the capacitor array that the capacitance distribution 922. As such, a well electric-magnetic field confinement as implemented in the multi-layer capacitor structure 810 can help to have a less mismatch and make the capacitance of the capacitor independent from or less impacted by the location of the capacitor.

Figure 10:
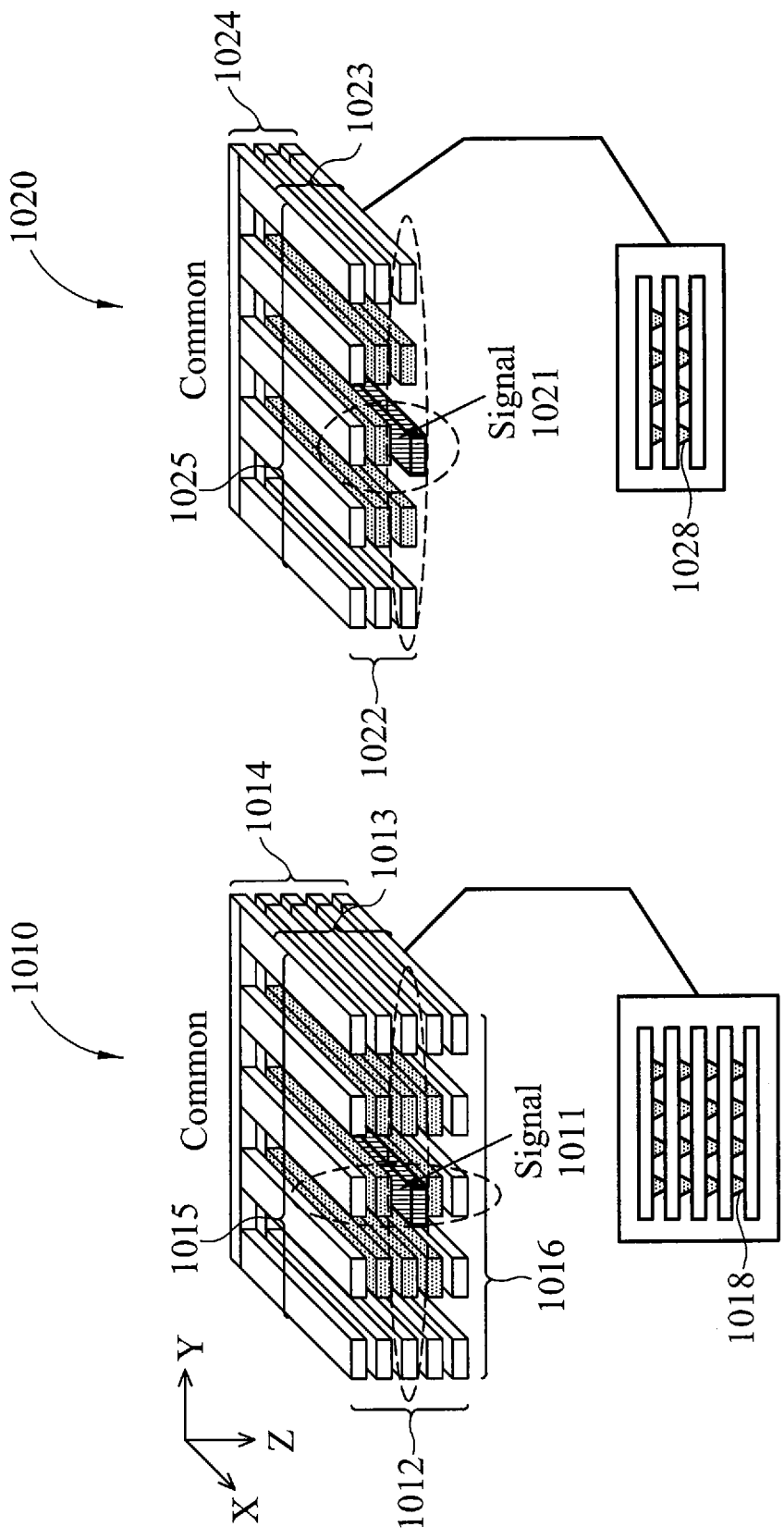
FIG. 10 illustrates perspective views of various exemplary capacitor structures for confining electric-magnetic field, in accordance with some embodiments of the present disclosure.

FIG. 10 illustrates perspective views of various exemplary capacitor structures for confining electric-magnetic field, in accordance with some embodiments of the present disclosure. Similar to the multi-layer capacitor structure 810, the multi-layer capacitor structure 1010 includes a plurality of finger layers arranged along a vertical direction, e.g. the Z direction in FIG. 10. The multi-layer capacitor structure 1010 has a signal electrode 1011 covered by a first side-wall 1012 from one side, by a second side-wall 1013 from the other side, by a top layer 1015 from the top side, by the bottom layer 1016 from the bottom side, and by a bus-wall 1014 from the back side. As such, the multi-layer capacitor structure 1010 creates a metal shelter formed by the metal fingers and bus lines of the common electrode, to protect the signal electrode 1011. In addition, the multi-layer capacitor structure 1010 includes one or more side-wall vias 1018 passing through the multiple layers along the Z direction on each of the side-walls 1012, 1013. In some embodiments, the multi-layer capacitor structure 1010 may also include one or more vias passing through the multiple layers along the Z direction on the bus-wall 1014. The vias may be metal lines that can help to confine electric-magnetic field within the multi-layer capacitor structure 1010 and reduce fringe effect of the multi-layer capacitor structure 1010. In some embodiments, the multi-layer capacitor structure 1010 may also include one or more metal lines passing through the metal fingers along the Y direction on the top layer 1015 and/or the bottom layer 1016.

In contrast to the multi-layer capacitor structure 1010, the multi-layer capacitor structure 1020 in FIG. 10 has an open bottom layer where the signal electrode 1021 is not covered by any other metal under the signal electrode 1021. Similar to the multi-layer capacitor structure 620 in FIG. 6B, the signal electrode 1021 in the multi-layer capacitor structure 1020 is covered by a first side-wall 1022 from one side, by a second side-wall 1023 from the other side, by a top layer 1025 from the top side, and by a bus-wall 1024 from the back side. As such, the multi-layer capacitor structure 1020 creates a metal shelter for the signal electrode 1021 with an opening on the bottom side of the signal electrode 1021. The multi-layer capacitor structure 1020 has a structure similar to that of the multi-layer capacitor structure 620 in FIG. 6B, except that the multi-layer capacitor structure 1020 includes one or more side-wall vias 1028 passing through the multiple layers along the Z direction on each of the side-walls 1022, 1023. In some embodiments, the multi-layer capacitor structure 1020 may also include one or more vias passing through the multiple layers along the Z direction on the bus-wall 1024. The vias may be metal lines that can help to confine electric-magnetic field within the multi-layer capacitor structure 1020 and reduce fringe effect of the multi-layer capacitor structure 1020. In some embodiments, the multi-layer capacitor structure 1020 may also include one or more metal lines passing through the metal fingers along the Y direction on the top layer 1025.

Due to the open bottom layer, the multi-layer capacitor structure 1020 has a smaller parasitic capacitance than that of the multi-layer capacitor structure 1010. In addition, it is easier for the multi-layer capacitor structure 1020 to be routed or connected to other components in the integrated circuit, compared to the multi-layer capacitor structure 1010. On the other hand, the multi-layer capacitor structure 1010 has a better protection of the signal electrode and a better confinement of electric-magnetic field within the capacitor, compared to the multi-layer capacitor structure 1020, due to a full coverage of metal fingers around the signal electrode in the multi-layer capacitor structure 1010. According to various embodiments, a multi-layer capacitor structure like the multi-layer capacitor structure 1020 may have an open bottom layer, an open top layer, or both.

Figure 11:
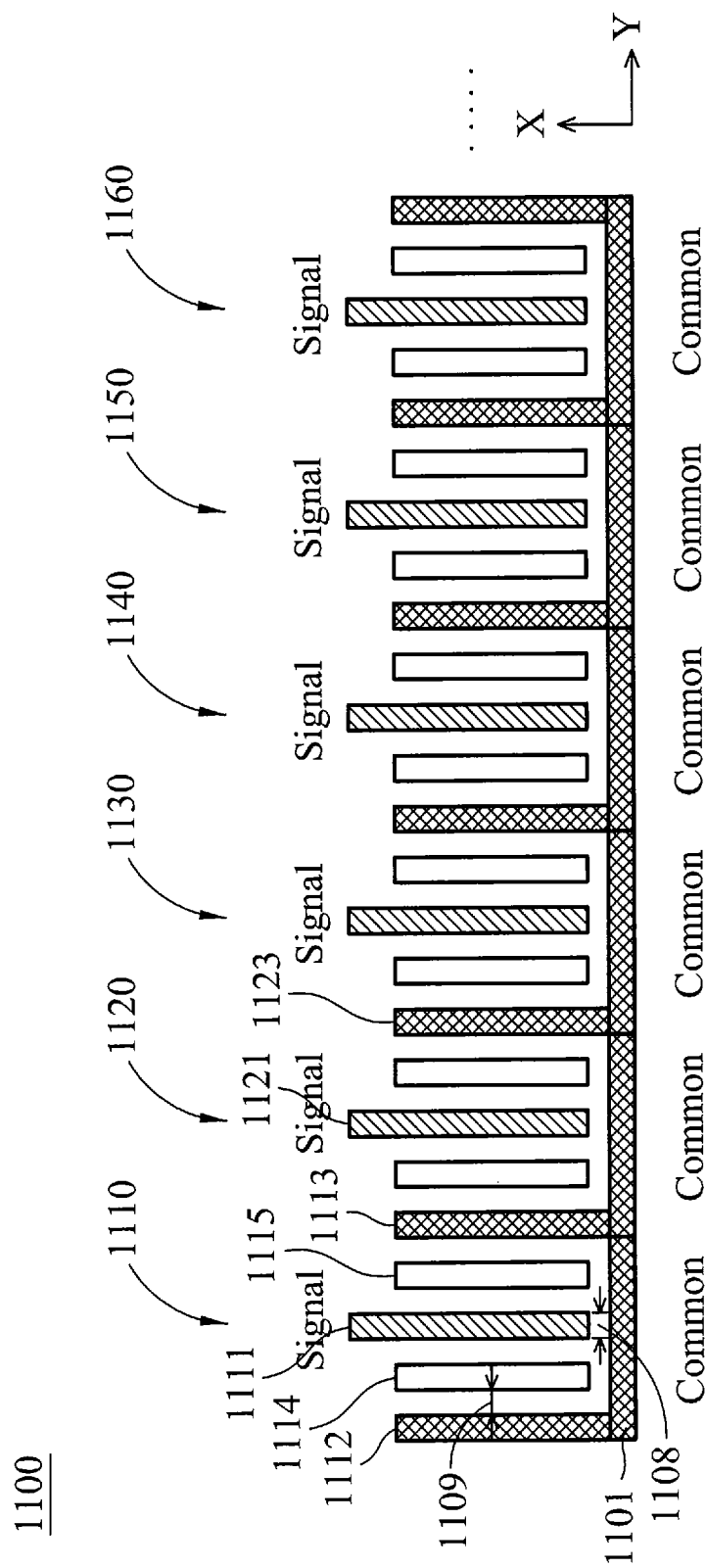
FIG. 11 is a cross-sectional view of an exemplary capacitor array, in accordance with some embodiments of the present disclosure.

FIG. 11 is a cross-sectional view of an exemplary capacitor array 1100, in accordance with some embodiments of the present disclosure. As shown in FIG. 11, the capacitor array 1100 includes a plurality of unit capacitors 1110, 1120, 1130, 1140, 1150, 1160 connected in series. Each of the plurality of unit capacitors has a same structure. For example, the unit capacitor 1110 includes a signal electrode having a single metal finger 1111, a common electrode having two side metal fingers 1112, 1113, and dummy metal fingers 1114, 1115 each being inserted between the two electrodes. Specifically, the dummy metal finger 1114 is formed in the middle between the single metal finger 1111 and the side metal finger 1112; while the dummy metal finger 1115 is formed in the middle between the single metal finger 1111 and the side metal finger 1113. As such, the unit capacitor 1110 has one dummy metal finger inserted on each side of the signal electrode. In this embodiment, each of the plurality of unit capacitors has a same number of dummy metal fingers. In some embodiments, each unit capacitor can have N dummy metal fingers inserted on each side of the signal electrode, as shown in FIG. 4.

The capacitor array 1100 includes a common bus line 1101 shared by the plurality of unit capacitors. The bus line 1101 is coupled to the two side metal fingers of the common electrode of each of the plurality of unit capacitors. The common electrodes of each pair of neighboring unit capacitors in the capacitor array 1100 share a common side metal finger. For example, the unit capacitor 1110 and the unit capacitor 1120 share the common side metal finger 1113; while the unit capacitor 1120 and the unit capacitor 1130 share the common side metal finger 1123.

In one embodiment, distances measured along the Y direction between every pair of neighboring metal fingers in the capacitor array 1100 are the same. That is, each unit capacitor in the capacitor array 1100 has a same finger-to-finger space 1109. The finger-to-finger space 1109 may be minimized for saving circuit area, e.g. by controlling the finger-to-finger space 1109 to be less than a first predetermined threshold. In addition, each metal finger in the capacitor array 1100 has a same width 1108 that is measured along the Y direction and is minimized for saving circuit area, e.g. by controlling the finger width 1108 to be less than a second predetermined threshold, such that each of the plurality of unit capacitors in the capacitor array 1100 has a same metal density along the Y direction. Each unit capacitor in the capacitor array 1100 may have a structure as shown in any of FIG. 1A-FIG. 10 according to different embodiments of the present disclosure.

Figure 12:
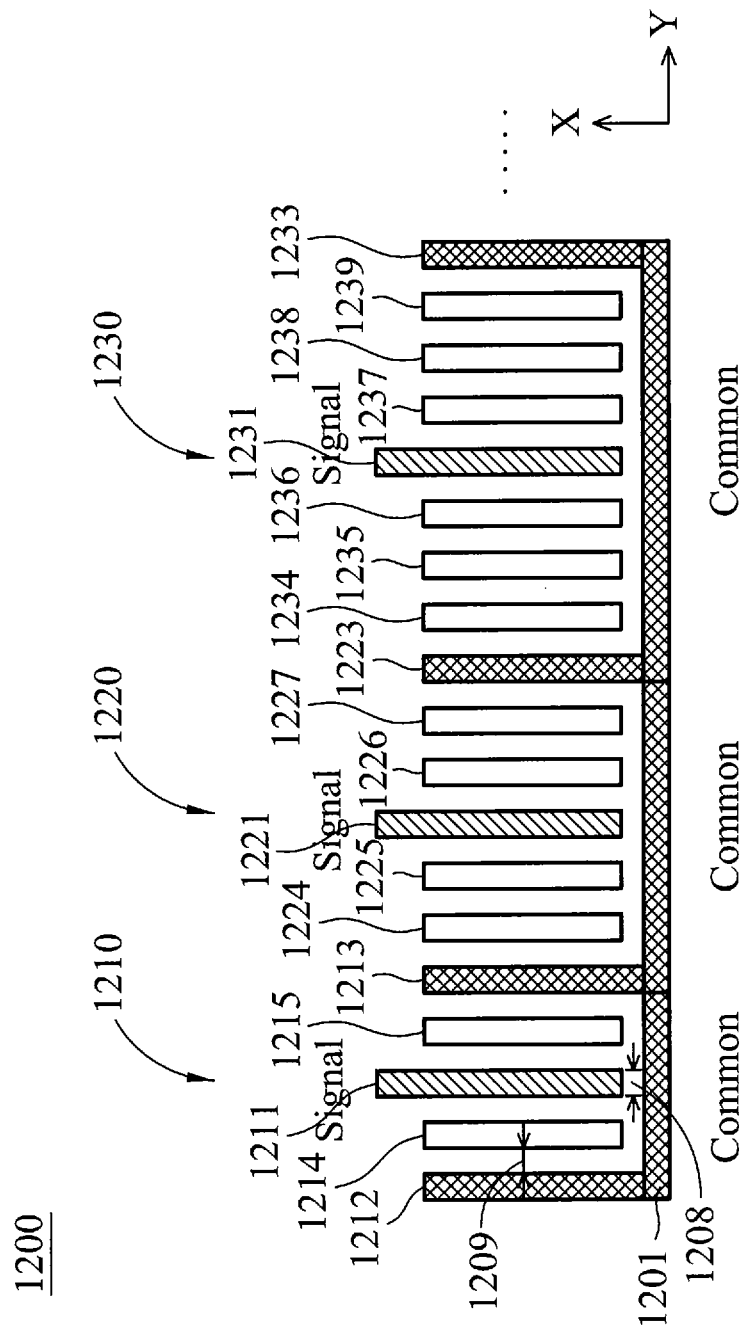
FIG. 12 is a cross-sectional view of another exemplary capacitor array, in accordance with some embodiments of the present disclosure.

FIG. 12 is a cross-sectional view of another exemplary capacitor array 1200, in accordance with some embodiments of the present disclosure. As shown in FIG. 12, the capacitor array 1200 includes a plurality of unit capacitors 1210, 1220, 1230 connected in series. Each of the plurality of unit capacitors has a similar structure to the unit capacitor 1110. For example, the unit capacitor 1210 includes a signal electrode having a single metal finger 1211, a common electrode having two side metal fingers 1212, 1213, and dummy metal fingers 1214, 1215 each being inserted between the two electrodes. Specifically, the dummy metal finger 1214 is formed in the middle between the single metal finger 1211 and the side metal finger 1212; while the dummy metal finger 1215 is formed in the middle between the single metal finger 1211 and the side metal finger 1213. As such, the unit capacitor 1210 has one dummy metal finger inserted on each side of the signal electrode. In this embodiment, at least two unit capacitors in the capacitor array 1200 have different numbers of dummy metal fingers. For example, the unit capacitor 1220 has two dummy metal fingers inserted on each side of the signal electrode; and the unit capacitor 1230 has three dummy metal fingers inserted on each side of the signal electrode.

The capacitor array 1200 includes a common bus line 1201 shared by the plurality of unit capacitors. The bus line 1201 is coupled to the two side metal fingers of the common electrode of each of the plurality of unit capacitors. The common electrodes of each pair of neighboring unit capacitors in the capacitor array 1200 share a common side metal finger. For example, the unit capacitor 1210 and the unit capacitor 1220 share the common side metal finger 1213; while the unit capacitor 1220 and the unit capacitor 1230 share the common side metal finger 1223.

In one embodiment, distances measured along the Y direction between every pair of neighboring metal fingers in the capacitor array 1200 are the same. That is, each unit capacitor in the capacitor array 1200 has a same finger-to-finger space 1209. The finger-to-finger space 1209 may be minimized for saving circuit area, e.g. by controlling the finger-to-finger space 1209 to be less than a predetermined threshold. In addition, each metal finger in the capacitor array 1200 has a same width 1208 that is measured along the Y direction and is minimized for saving circuit area, e.g. by controlling the finger width 1208 to be less than a predetermined threshold, such that each of the plurality of unit capacitors in the capacitor array 1200 has a same metal density along the Y direction. In various embodiments, each unit capacitor in the capacitor array 1200 may have a structure as shown in any of FIG. 1A-FIG. 10 according to different embodiments of the present disclosure.

Figure 13:
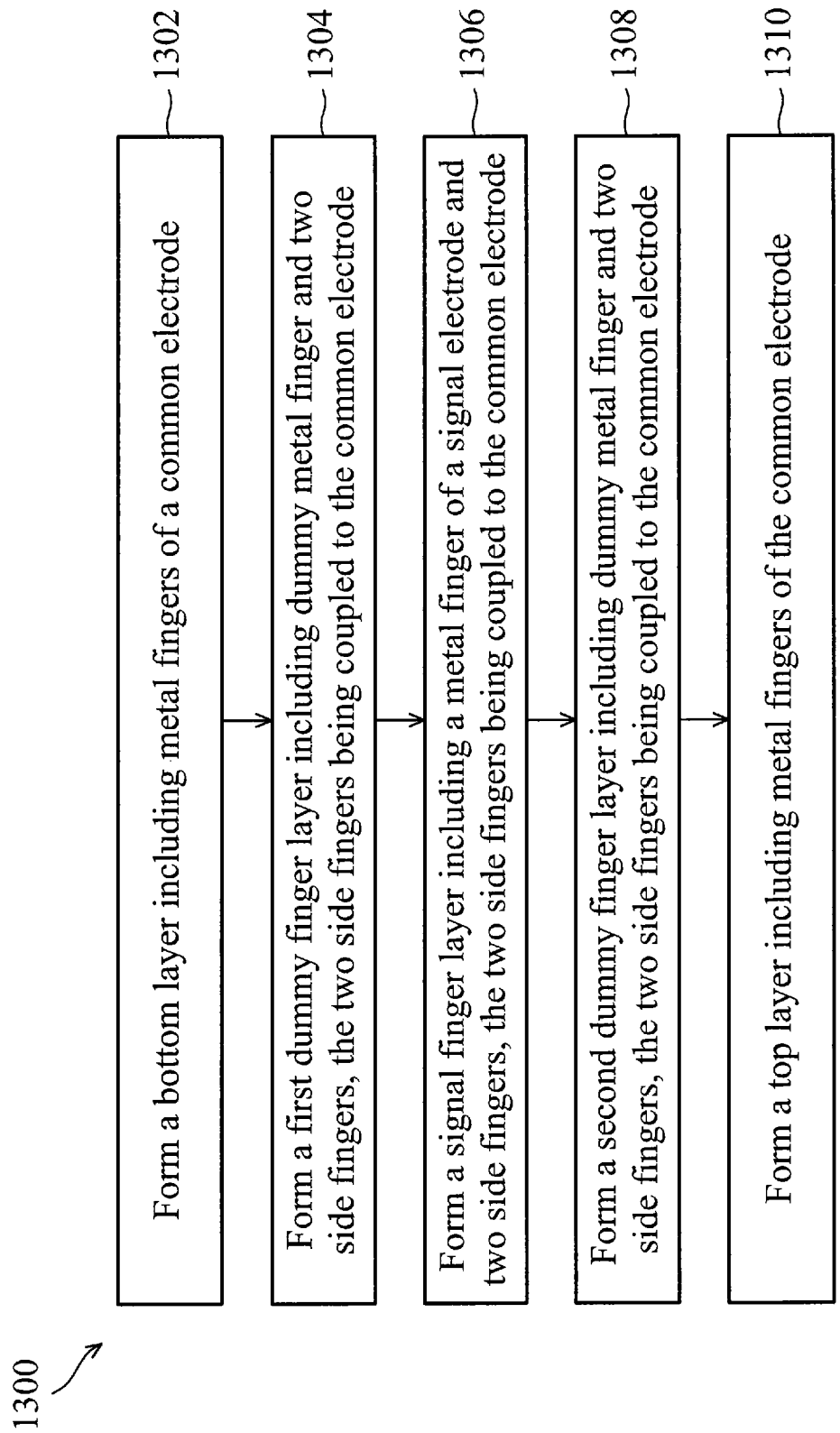
FIG. 13 is a flow chart illustrating an exemplary method for forming a capacitor structure, in accordance with some embodiments of the present disclosure.

FIG. 13 is a flow chart illustrating an exemplary method 1300 for forming a capacitor structure, e.g. the 1010 in FIG. 10, in accordance with some embodiments of the present disclosure. At operation 1302, a bottom layer including metal fingers of a common electrode is formed. At operation 1304, a first dummy finger layer is formed. The first dummy finger layer includes at least one dummy metal finger and two side metal fingers. The two side metal fingers are coupled to the common electrode, e.g. via a bus line. A signal finger layer is formed at operation 1306. The signal finger layer includes a metal finger of a signal electrode and two side metal fingers. The two side metal fingers are coupled to the common electrode, e.g. via the bus line. At operation 1308, a second dummy finger layer is formed. The second dummy finger layer includes at least one dummy metal finger and two side metal fingers. The two side metal fingers are coupled to the common electrode, e.g. via the bus line. At operation 1310, a top layer including metal fingers of the common electrode is formed. The order of the steps shown in FIG. 13 may be changed according to different embodiments of the present disclosure.

Figure 14:
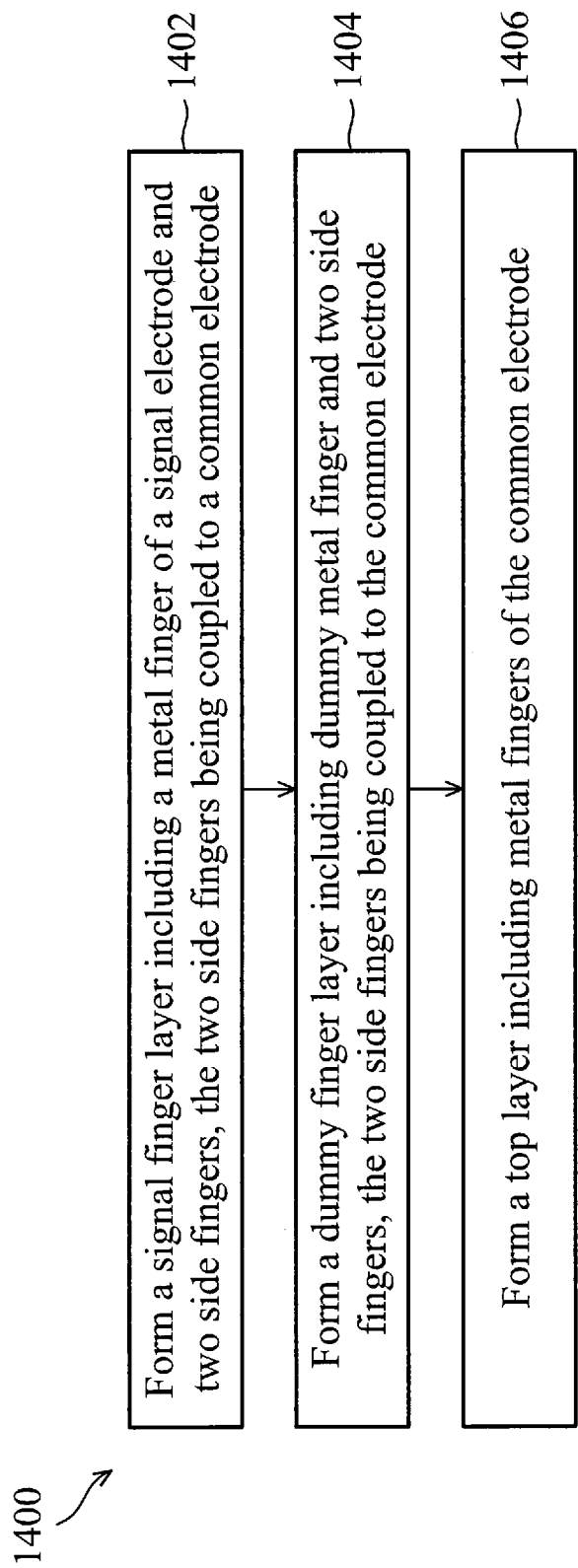
FIG. 14 is a flow chart illustrating another exemplary method for forming a capacitor structure, in accordance with some embodiments of the present disclosure.

FIG. 14 is a flow chart illustrating another exemplary method 1400 for forming a capacitor structure, e.g. the 1020 in FIG. 10, in accordance with some embodiments of the present disclosure. At operation 1402, a signal finger layer is formed. The signal finger layer includes a metal finger of a signal electrode and two side metal fingers. The two side metal fingers are coupled to a common electrode, e.g. via a bus line. At operation 1404, a dummy finger layer is formed. The dummy finger layer includes at least one dummy metal finger and two side metal fingers. The two side metal fingers are coupled to the common electrode, e.g. via the bus line. At operation 1406, a top layer including metal fingers of the common electrode is formed. The order of the steps shown in FIG. 14 may be changed according to different embodiments of the present disclosure.

In an embodiment of the present teaching, a capacitor structure is disclosed. The capacitor structure includes a first electrode and a second electrode. The first electrode comprises a first metal finger. The second electrode comprises a second metal finger and a third metal finger that are parallel to each other and to the first metal finger. The first metal finger is formed between the second metal finger and the third metal finger. The capacitor structure further includes: a fourth metal finger formed as a dummy metal finger between the first metal finger and the second metal finger, and a fifth metal finger formed as a dummy metal finger between the first metal finger and the third metal finger. The fourth metal finger and the fifth metal finger are parallel to the first metal finger.

In another embodiment of the present teaching, a capacitor structure is disclosed. The capacitor structure includes a first electrode, a second electrode, and at least one dummy metal finger. The first electrode comprises a first metal finger. The second electrode comprises a plurality of metal fingers. Each of the plurality of metal fingers is parallel to the first metal finger. The at least one dummy metal finger is formed between the first metal finger and one of the plurality of metal fingers. The at least one dummy metal finger is parallel to the first metal finger.

In yet another embodiment of the present teaching, a capacitor array is disclosed. The capacitor array includes a plurality of unit capacitors connected in series. Each of the plurality of unit capacitors includes a first electrode, a second electrode, and at least one dummy metal finger. The first electrode comprises a first metal finger. The second electrode comprises two side metal fingers. Each of the two side metal fingers is parallel to the first metal finger. The first metal finger is formed between the two side metal fingers. The at least one dummy metal finger is formed between the first metal finger and one of the two side metal fingers. The at least one dummy metal finger is parallel to the first metal finger.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A capacitor structure, comprising:
a first electrode comprising a first metal finger;
a second electrode comprising a plurality of metal fingers, wherein each of the plurality of metal fingers is parallel to the first metal finger; and
at least one dummy metal finger formed between the first metal finger and one of the plurality of metal fingers, wherein the at least one dummy metal finger is parallel to the first metal finger,
wherein the first metal finger, the plurality of metal fingers, and the at least one dummy metal finger form a plurality of finger layers,
wherein the capacitor structure comprises a plurality of sub-capacitors connected in series, and each of the plurality of sub-capacitors is formed by a pair of metal fingers in the capacitor structure.

2. The capacitor structure of claim 1, wherein:
the plurality of finger layers are arranged along a first direction; and
each of the plurality of finger layers includes a same number of metal fingers arranged along a second direction that is orthogonal to the first direction.

3. The capacitor structure of claim 1, wherein:
the second electrode comprises a plurality of bus lines each of which corresponds to one of the plurality of finger layers; and
the plurality of bus lines form a bus-wall of the capacitor structure.

4. The capacitor structure of claim 3, wherein:
each of the plurality of finger layers includes a first side metal finger coupled to the bus line corresponding to the finger layer, a second side metal finger coupled to the bus line corresponding to the finger layer, and at least one middle metal finger formed between the first side metal finger and the second side metal finger;
the first side metal fingers of the plurality of finger layers form a first side-wall of the capacitor structure; and
the second side metal fingers of the plurality of finger layers form a second side-wall of the capacitor structure.

5. The capacitor structure of claim 4, wherein:
the first side metal fingers of the plurality of finger layers are connected by at least one via passing through the plurality of finger layers along the first direction on the first side-wall;
the second side metal fingers of the plurality of finger layers are connected by at least one via passing through the plurality of finger layers along the first direction on the second side-wall; and
the plurality of bus lines are connected by at least one via passing through the plurality of finger layers along the first direction on the bus-wall.

6. The capacitor structure of claim 5, wherein the plurality of finger layers includes: a top finger layer, a bottom finger layer, and at least one middle finger layer formed between the top finger layer and the bottom finger layer.

7. The capacitor structure of claim 6, wherein for at least one of the top finger layer and the bottom finger layer, each of the at least one middle metal finger in the finger layer is coupled to the bus line corresponding to the finger layer.

8. The capacitor structure of claim 6, wherein for at least one of the top finger layer and the bottom finger layer, the at least one middle metal finger in the finger layer comprises:
the first metal finger in the first electrode;
one or more middle metal fingers that are formed between the first metal finger and the first side metal finger and are not connected to the first electrode or the second electrode; and
one or more middle metal fingers that are formed between the first metal finger and the second side metal finger and are not connected to the first electrode or the second electrode.

9. The capacitor structure of claim 6, wherein for one of the at least one middle finger layer, the at least one middle metal finger in the finger layer comprises:
the first metal finger in the first electrode;
one or more middle metal fingers that are formed between the first metal finger and the first side metal finger and are not connected to the first electrode or the second electrode; and
one or more middle metal fingers that are formed between the first metal finger and the second side metal finger and are not connected to the first electrode or the second electrode, wherein for each middle finger layer other than the one of the at least one middle finger layer, each of the at least one middle metal finger in the finger layer is a dummy metal that is not connected to the first electrode or the second electrode.

10. The capacitor structure of claim 1, wherein:
distances between every pair of neighboring metal fingers in the capacitor structure are the same and less than a first predetermined threshold; and
each distance between a pair of neighboring metal fingers is measured along a direction that is orthogonal to the pair of neighboring metal fingers.

11. The capacitor structure of claim 10, wherein each metal finger in the capacitor structure has a width that is measured along the direction and less than a second predetermined threshold.

12. A method for manufacturing a capacitor structure, comprising:
forming a bottom layer including at least one metal finger of a common electrode of the capacitor structure;
forming a first dummy finger layer including at least one dummy metal finger and first two side fingers, wherein the first two side fingers are coupled to the common electrode;
forming a signal finger layer including a metal finger of a signal electrode of the capacitor structure and second two side fingers, wherein the second two side fingers are coupled to the common electrode; and
forming a top layer including at least one metal finger of the common electrode.

13. The method of claim 12, further comprising:
forming a second dummy finger layer including at least one dummy metal finger and third two side fingers, wherein the third two side fingers are coupled to the common electrode.

14. A capacitor array, comprising a plurality of unit capacitors connected in series, wherein each of the plurality of unit capacitors comprises:
a first electrode comprising a first metal finger;

a second electrode comprising two side metal fingers, wherein each of the two side metal fingers is parallel to the first metal finger, wherein the first metal finger is formed between the two side metal fingers; and at least one dummy metal finger formed between the first metal finger and one of the two side metal fingers.

15. The capacitor array of claim 14, wherein the at least one dummy metal finger is parallel to the first metal finger.

16. The capacitor array of claim 14, wherein:

the capacitor array comprises a common bus line shared by the plurality of unit capacitors;

the common bus line is coupled to the two side metal fingers of the second electrode of each of the plurality of unit capacitors; and the second electrodes of each pair of neighboring unit capacitors in the plurality of unit capacitors share a common side metal finger.

17. The capacitor array of claim 14, wherein each of the plurality of unit capacitors has a same number of dummy metal fingers.

18. The capacitor array of claim 14, wherein at least two of the plurality of unit capacitors have different numbers of dummy metal fingers.

19. The capacitor array of claim 14, wherein:

distances between every pair of neighboring metal fingers in the capacitor array are the same and less than a first predetermined threshold;

each distance between a pair of neighboring metal fingers is measured along a direction that is orthogonal to the pair of neighboring metal fingers; and each metal finger in the capacitor array has a same width that is measured along the direction and less than a second predetermined threshold, such that each of the plurality of unit capacitors has a same metal density along the direction.

* * * * *